(12) United States Patent
Hsu

(10) Patent No.: US 9,972,392 B2
(45) Date of Patent: May 15, 2018

(54) SONOS BYTE-ERASABLE EEPROM

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days. days.

(21) Appl. No.: 15/076,519

(22) Filed: Mar. 21, 2016

(65) Prior Publication Data

US 2016/0307637 A1    Oct. 20, 2016

Related U.S. Application Data

(60) Provisional application No. 62/136,500, filed on Mar. 21, 2015, provisional application No. 62/143,118, filed on Apr. 5, 2015.

(51) Int. Cl.
| | | |
|---|---|---|
| *G11C 11/34* | (2006.01) | |
| *G11C 16/10* | (2006.01) | |
| *G11C 16/04* | (2006.01) | |
| *G11C 16/34* | (2006.01) | |

(52) U.S. Cl.
CPC .......... *G11C 16/10* (2013.01); *G11C 16/0466* (2013.01); *G11C 16/3427* (2013.01)

(58) Field of Classification Search
CPC .. G11C 16/10; G11C 16/3427; G11C 16/0466
See application file for complete search history.

(56) References Cited

U.S. PATENT DOCUMENTS

| | | | |
|---|---|---|---|
| 5,517,634 A | 5/1996 | Ehrlich | |
| 7,251,161 B2 | 7/2007 | Yano et al. | |
| 7,369,438 B2 * | 5/2008 | Lee | G11C 11/005 257/E27.103 |
| 2005/0135155 A1 | 6/2005 | Ishimaru et al. | |
| 2005/0185466 A1 | 8/2005 | Prall | |
| 2008/0096327 A1 * | 4/2008 | Lee | H01L 27/11524 438/129 |
| 2009/0003074 A1 | 1/2009 | Georgescu et al. | |
| 2009/0073767 A1 | 3/2009 | Miwa | |
| 2009/0268527 A1 | 10/2009 | Duuren et al. | |
| 2009/0310414 A1 * | 12/2009 | Lee | G11C 8/12 365/185.17 |

(Continued)

FOREIGN PATENT DOCUMENTS

WO    WO 2012/148092 A2    11/2012

OTHER PUBLICATIONS

International Search Report, dated Aug. 5, 2016, for corresponding International Application No. PCT/US2016/023476.

(Continued)

*Primary Examiner* — Mohammed A Bashar
(74) *Attorney, Agent, or Firm* — Intellectual Property Law Group LLP

(57) ABSTRACT

A SONOS byte-erasable EEPROM is disclosed. In one aspect, an apparatus includes a plurality of SONOS memory cells forming an EEPROM memory array. The apparatus also includes a controller that generates bias voltages to program and erase the memory cells. The controller performs a refresh operation when programming selected memory cells to reduce write-disturb on unselected memory cells to prevent data loss.

20 Claims, 27 Drawing Sheets

(56) References Cited

U.S. PATENT DOCUMENTS

| | | |
|---|---|---|
| 2010/0128536 A1 | 5/2010 | Akil et al. |
| 2011/0095353 A1 | 4/2011 | Lue |
| 2011/0307646 A1 | 12/2011 | Lee et al. |
| 2012/0106253 A1 | 5/2012 | Scheuerlein et al. |
| 2014/0050025 A1* | 2/2014 | Tsao .................. G11C 14/0063 365/185.08 |

OTHER PUBLICATIONS

Written Opinion of the International Searching Authority, dated Aug. 5, 2016, for corresponding International Application No. PCT/US2016/023476.

\* cited by examiner

|        | SELECTED BYTE |      |      |           |     | UNSELECTED CELLS |     |     |    |    |    |
|--------|------|------|------|-----------|-----|------|-----|-----|----|----|----|
| FROM SL | CG0 | DSG0 | SSG0 | BL (0-7)  | SL0 | CG   | DSG | SSG | BL | SL | NW |
| (1)    | -5   | 5    | -1   | F         | 5   | 5    | 5   | 5   | F  | 0  | 5  |
| (2)    | -5   | 5    | -6   | F         | 5   | 5    | 5   | 5   | F  | -5 | 5  |
| (3)    | 0    | 10   | 0    | F         | 10  | 10   | 10  | 10  | F  | 0  | 10 |

FIG. 3

|        | SELECTED BYTE |      |      |           |     | UNSELECTED CELLS |     |     |    |    |    |
|--------|------|------|------|-----------|-----|------|-----|-----|----|----|----|
| FROM BL | CG0 | DSG0 | SSG0 | BL (0-7)  | SL0 | CG   | DSG | SSG | BL | SL | NW |
| (4)    | -5   | -1   | 5    | 5         | F   | 5    | 5   | 5   | 0  | F  | 5  |
| (5)    | -5   | -6   | 5    | 5         | F   | 5    | 5   | 5   | -5 | F  | 5  |
| (6)    | 0    | 0    | 10   | 10        | F   | 10   | 10  | 10  | 0  | F  | 10 |

FIG. 4

|           | SELECTED BYTE |      |      |           |     | UNSELECTED CELLS |     |     |    |    |    |
|-----------|------|------|------|-----------|-----|------|-----|-----|----|----|----|
| FROM BL&SL | CG0 | DSG0 | SSG0 | BL (0-7) | SL0 | CG   | DSG | SSG | BL | SL | NW |
| (7)       | -5   | -1   | -1   | 5         | 5   | 5    | 5   | 5   | 0  | 0  | 5  |
| (8)       | -5   | -6   | -6   | 5         | 5   | 5    | 5   | 5   | -5 | -5 | 5  |
| (9)       | 0    | 0    | 0    | 10        | 10  | 10   | 10  | 10  | 0  | 0  | 10 |

FIG. 5

|      | SELECTED BYTE |      |      |           |     | UNSELECTED CELLS |     |     |    |    |    |
|------|------|------|------|-----------|-----|------|-----|-----|----|----|----|
| BTBT | CG0  | DSG0 | SSG0 | BL (0-7)  | SL0 | CG   | DSG | SSG | BL | SL | NW |
| (10) | 5    | -1   | 5    | 0/5       | F   | 5    | 5   | 5   | 5  | F  | 5  |
| (11) | 0    | -6   | 0    | -5/0      | F   | 0    | 0   | 0   | 0  | F  | 0  |
| (12) | 3    | -4   | 3    | -3/3      | F   | 3    | 3   | 3   | 3  | F  | 3  |

FIG. 6

| | SELECTED BYTE | | | | | UNSELECTED CELLS | | | | | |
|---|---|---|---|---|---|---|---|---|---|---|---|
| PAHE (BL) | CG0 | DSG0 | SSG0 | BL (0-7) | SL0 | CG | DSG | SSG | BL | SL | NW |
| (13) | 5 | -1 | 0 | 0/5 | 5 | 5 | 5 | 5 | 5 | F | 5 |
| (14) | 0 | -6 | -1 | -5/0 | 0 | 0 | 0 | 0 | 0 | F | 0 |
| (15) | 3 | -4 | 0 | -3/3 | 3 | 3 | 3 | 3 | 3 | F | 3 |

FIG. 7

| | SELECTED BYTE | | | | | UNSELECTED CELLS | | | | | |
|---|---|---|---|---|---|---|---|---|---|---|---|
| PAHE (SL) | CG0 | DSG0 | SSG0 | BL (0-7) | SL0 | CG | DSG | SSG | BL | SL | NW |
| (16) | 5 | -1 | -1 | 5/0 | 0 | 5 | 5 | 5 | 5 | F | 5 |
| (17) | 0 | -6 | -6 | 0/-5 | -5 | 0 | 0 | 0 | 0 | F | 0 |
| (18) | 3 | -4 | -4 | 3/-3 | -3 | 3 | 3 | 3 | 3 | F | 3 |

FIG. 8

| | SELECTED BYTE | | | | | UNSELECTED CELLS | | | | | |
|---|---|---|---|---|---|---|---|---|---|---|---|
| CHE (SL) | CG0 | DSG0 | SSG0 | BL (0-7) | SL0 | CG | DSG | SSG | BL | SL | NW |
| (19) | 4 | -1 | 0 | 0/5 | 5 | 5 | 5 | 5 | 5 | F | 5 |
| (20) | -1 | -6 | -1 | -5/0 | 0 | 0 | 0 | 0 | 0 | F | 0 |
| (21) | 2 | -4 | 0 | -3/3 | 3 | 3 | 3 | 3 | 3 | F | 3 |

FIG. 9

| | SELECTED BYTE | | | | | UNSELECTED CELLS | | | | | |
|---|---|---|---|---|---|---|---|---|---|---|---|
| CHE (BL) | CG0 | DSG0 | SSG0 | BL (0-7) | SL0 | CG | DSG | SSG | BL | SL | NW |
| (22) | 4 | 0 | -1 | 5/0 | 0 | 5 | 5 | 5 | F | F | 5 |
| (23) | -1 | -1 | -6 | 0/-5 | -5 | 0 | 0 | 0 | F | F | 0 |
| (24) | 2 | 0 | -4 | 3/-3 | -3 | 3 | 3 | 3 | F | F | 3 |

FIG. 10

| FROM SL | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (1) | 5 | -5 | 1 | F | -5 | -5 | -5 | -5 | F | 0 | -5 |
| (2) | 5 | -5 | 6 | F | -5 | -5 | -5 | -5 | F | 5 | -5 |
| (3) | 10 | 0 | 11 | F | 0 | 0 | 0 | 0 | F | 10 | 0 |

FIG. 15

| FROM BL | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (4) | 5 | 1 | -5 | -5 | F | -5 | -5 | -5 | 0 | F | -5 |
| (5) | 5 | 6 | -5 | -5 | F | -5 | -5 | -5 | 5 | F | -5 |
| (6) | 10 | 11 | 0 | 0 | F | 0 | 0 | 0 | 10 | F | 0 |

FIG. 16

| FROM BL&SL | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (7) | 5 | 1 | 1 | -5 | -5 | -5 | -5 | -5 | 0 | 0 | -5 |
| (8) | 5 | 6 | 6 | -5 | -5 | -5 | -5 | -5 | 5 | 5 | -5 |
| (9) | 10 | 11 | 11 | 0 | 0 | 0 | 0 | 0 | 10 | 10 | 0 |

FIG. 17

| BTBT | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (1) | 0 | 6 | 0 | 5/0 | F | 0 | 0 | 0 | 0 | F | 0 |
| (2) | -5 | 1 | 0 | 0/-5 | F | -5 | -5 | -5 | -5 | F | -5 |
| (3) | -3 | 4 | -3 | 3/-3 | F | -3 | -3 | -3 | -3 | F | -3 |

FIG. 18

| PAHE (BL) | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (1) | 0 | 6 | 1 | 5/0 | 0 | 0 | 0 | 0 | 0 | F | 0 |
| (2) | -5 | 1 | 0 | 0/-5 | -5 | -5 | -5 | -5 | -5 | F | -5 |
| (3) | -3 | 4 | 0 | 3/-3 | -3 | -3 | -3 | -3 | -3 | F | -3 |

FIG. 19

| PAHE (SL) | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (7) | 0 | 1 | 6 | 0/5 | 5 | 0 | 0 | 0 | 0 | F | 0 |
| (8) | -5 | 0 | 1 | -5/0 | 0 | -5 | -5 | -5 | 5 | F | -5 |
| (9) | -3 | 0 | 4 | -3/3 | 3 | -3 | -3 | -3 | -3 | F | -3 |

FIG. 20

| CHE (SL) | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (10) | 5 | 1 | 6 | 0/5 | 5 | 5 | 5 | 5 | 5 | F | 0 |
| (11) | 0 | 0 | 1 | -5/0 | 0 | 0 | 0 | 0 | 0 | F | -5 |
| (12) | 3 | 0 | 4 | -3/3 | 3 | 3 | 3 | 3 | 3 | F | -3 |

FIG. 21

| CHE (BL) | SELECTED BYTE | | | | | UNSELECTED CELLS | | | | | TPW |
|---|---|---|---|---|---|---|---|---|---|---|---|
| | CG0 | DSG0 | SSG0 | BL (0-7) | SL0 | CG | DSG | SSG | BL | SL | |
| (13) | 5 | 6 | 1 | 5/0 | 0 | 5 | 5 | 5 | 5 | F | 0 |
| (14) | 0 | 1 | 0 | 0/-5 | -5 | 0 | 0 | 0 | 0 | F | -5 |
| (15) | 3 | 4 | 0 | 3/-3 | -3 | 3 | 3 | 3 | 3 | F | -3 |

FIG. 22

| | Selected byte | | | | Unselected byte | | | | |
|---|---|---|---|---|---|---|---|---|---|
| | CG0 | SG0 | BL0-n | SL0 | CGm | SGm | BLi-(i+n) | SLk | NW |
| (1) | -5 | 5 | F | 5 | 5 | 5 | F | 0-2 | 5 |
| (2) | -10 | 0 | F | 0 | 0 | 0 | F | -5 to -7 | 0 |
| (3) | 0 | 10 | F | 10 | 10 | 10 | F | 5-7 | 10 |
| (4) | -5 | 0 | 5 | F | 5 | 5 | 0-2 | F | 5 |
| (5) | -10 | ≤-1 | 0 | F | 0 | 0 | -5 to -7 | F | 0 |
| (6) | 0 | ≤9 | 10 | F | 10 | 10 | 5-7 | F | 10 |

| | Selected byte | | | | | Unselected byte | | | | |
|---|---|---|---|---|---|---|---|---|---|---|
| | CG0 | SG0 | BL0-n | SL0 | NW0 | CGm | SGm | BLi-(i+n) | SLk | NWk |
| (1) | -5 | 5 | F | 5 | 5 | 2.5 | 5 | F | 0-2 | 0 |
| (2) | -10 | 0 | F | 0 | 0 | -2.5 | 0 | F | -5 to -7 | -5 |
| (3) | 0 | 10 | F | 10 | 10 | 7.5 | 10 | F | 5-7 | 5 |
| (4) | -5 | 5 | 5 | F | 5 | 2.5 | 5 | 0-2 | F | 0 |
| (5) | -10 | 0 | 0 | F | 0 | -2.5 | 0 | -5 to -7 | F | -5 |
| (6) | 0 | 10 | 10 | F | 10 | 7.5 | 10 | 5-7 | F | 5 |

| | Selected byte | | | | | | | Unselected byte | | | | | |
|---|---|---|---|---|---|---|---|---|---|---|---|---|---|
| | CG0 | SG0 | BL0-n | SL0 | PG0 | NW0a | NW0b | CGm | SGm | BLi-(i+n) | SLk | PGk | NWka | NWkb |
| (1) | -5 | 5 | F | 5 | ≤-6 | 5 | 5 | 5 | 5 | F | 0 | 5 | 5 | 0 |
| (2) | -10 | 0 | F | 0 | ≤-11 | 0 | 0 | 0 | 0 | F | -5 | 0 | 0 | -5 |
| (3) | 0 | 10 | F | 10 | ≤-1 | 10 | 10 | 10 | 10 | F | 5 | 10 | 10 | 5 |
| (4) | -5 | 5 | 5 | F | ≤-6 | 5 | 5 | 5 | 5 | 0 | F | 5 | 5 | 0 |
| (5) | -10 | 0 | 0 | F | ≤-11 | 0 | 0 | 0 | 0 | -5 | F | 0 | 0 | -5 |
| (6) | 0 | 10 | 10 | F | ≤-1 | 10 | 10 | 10 | 10 | 5 | F | 10 | 10 | 5 |

| | Selected byte | | | | | | | Unselected byte | | | | | | |
|---|---|---|---|---|---|---|---|---|---|---|---|---|---|---|
| | CG0 | SG0 | BL0-n | SL0 | PG0 | TPW0 | NW0 | CGm | SGm | BLi-(i+n) | SLk | PGk | TPWk | NWk |
| (1) | -5 | 5 | F | 5 | ≥6 | 5 | 5 | 5 | 5 | F | 0 | ≤-5 | 5 | 0 |
| (2) | -10 | 0 | F | 0 | ≥1 | 0 | 0 | 0 | 0 | F | -5 | ≤-10 | 0 | -5 |
| (3) | 0 | 10 | F | 10 | ≥11 | 10 | 10 | 10 | 10 | F | 5 | ≤0 | 10 | 5 |
| (4) | -5 | 5 | 5 | F | ≥6 | 5 | 5 | 5 | 5 | 0 | F | ≤-5 | 5 | 0 |
| (5) | -10 | 0 | 0 | F | ≥1 | 0 | 0 | 0 | 0 | -5 | F | ≤-10 | 0 | -5 |
| (6) | 0 | 10 | 10 | F | ≥11 | 10 | 10 | 10 | 10 | 5 | F | ≤0 | 10 | 5 |

|  | Selected byte | | | | Unselected byte | | | | NW |
|---|---|---|---|---|---|---|---|---|---|
|  | CG0 | SG0 | BL0-n | SL0 | CGm | SGm | BLi-(i+n) | SLk |  |
| (1) | -5 | 0 | F | 5 | 5 | 5 | F | 0-2 | 5 |
| (2) | -10 | ≤-1 | F | 0 | 0 | 0 | F | -5 to -7 | 0 |
| (3) | 0 | ≤9 | F | 10 | 10 | 10 | F | 5-7 | 10 |

| | Selected byte | | | | Unselected byte | | | | |
|---|---|---|---|---|---|---|---|---|---|
| | CG0 | SG0 | BL0-n | SL0 | CGm | SGm | BLi-(i+n) | SLk | TPW |
| (1) | 5 | 0 | F | -5 | -5 | -5 | F | 0 to -2 | -5 |
| (2) | 0 | 0 | F | -10 | -10 | -10 | F | -5 to -7 | -10 |
| (3) | 10 | 6 | F | 0 | 0 | 0 | F | 3-5 | 0 |
| (4) | 5 | 0 | -5 | F | -5 | -5 | 0 to -2 | F | -5 |
| (5) | 0 | 0 | -10 | F | -10 | -10 | -5 to -7 | F | -10 |
| (6) | 10 | 6 | 0 | F | 0 | 0 | 3-5 | F | 0 |

| | Selected byte | | | | | Unselected byte | | | | |
|---|---|---|---|---|---|---|---|---|---|---|
| | CG0 | SG0 | BL0-n | SL0 | TPW0 | CGm | SGm | BLi-(i+n) | SLk | TPWk |
| (1) | 5 | 0 | F | -5 | -5 | -2.5 | -5 | F | 0 to-2 | 0 |
| (2) | 0 | 0 | F | -10 | -10 | -7.5 | -10 | F | - 5 to-7 | -5 |
| (3) | 10 | 6 | F | 0 | 0 | 2.5 | 0 | F | 3-5 | 5 |
| (4) | 5 | 0 | -5 | F | -5 | -2.5 | -5 | 0 to-2 | F | 0 |
| (5) | 0 | 0 | -10 | F | -10 | -7.5 | -10 | - 5 to-7 | F | -5 |
| (6) | 10 | 6 | 0 | F | 0 | 2.5 | 0 | 3-5 | F | 5 |

| | Selected byte | | | | | | | Unselected byte | | | | | |
|---|---|---|---|---|---|---|---|---|---|---|---|---|---|
| | CG0 | SG0 | BL0-n | SL0 | PG0 | TPW0a | TPW0b | CGm | SGm | BLi-(i+n) | SLk | PGk | TPWka | TPWkb |
| (1) | 5 | 0 | F | -5 | ≥6 | -5 | -5 | -5 | -5 | F | 0 to -2 | -5 | -5 | 0 |
| (2) | 0 | 0 | F | -10 | ≥1 | -10 | -10 | -10 | -10 | F | -5 to -7 | -10 | -10 | -5 |
| (3) | 10 | 6 | F | 0 | ≥11 | 0 | 0 | 0 | 0 | F | 3-5 | 0 | 0 | 5 |
| (4) | 5 | 0 | -5 | F | ≥6 | -5 | -5 | -5 | -5 | 0 to -2 | F | -5 | -5 | 0 |
| (5) | 0 | 0 | -10 | F | ≥1 | -10 | -10 | -10 | -10 | -5 to -7 | F | -10 | -10 | -5 |
| (6) | 10 | 6 | 0 | F | ≥11 | 0 | 0 | 0 | 0 | 3-5 | F | 0 | 0 | 5 |

| | Selected byte | | | | | | | Unselected byte | | | | | | |
|---|---|---|---|---|---|---|---|---|---|---|---|---|---|---|
| | CG0 | SG0 | BL0-n | SL0 | PG0 | TPW0 | NW0 | CGm | SGm | BLi-(i+n) | SLk | PGk | TPWk | NWk |
| (1) | 5 | 0 | F | -5 | ≤-6 | -5 | -5 | -5 | -5 | F | 0 to -2 | 5 | -5 | 0 |
| (2) | 0 | 0 | F | -10 | ≤-11 | -10 | -10 | -10 | -10 | F | -5 to -7 | 0 | -10 | -5 |
| (3) | 10 | 6 | F | 0 | ≤-1 | 0 | 0 | 0 | 0 | F | 3-5 | 10 | 0 | 5 |
| (4) | 5 | 0 | -5 | F | ≤-6 | -5 | -5 | -5 | -5 | 0 to -2 | F | 5 | -5 | 0 |
| (5) | 0 | 0 | -10 | F | ≤-11 | -10 | -10 | -10 | -10 | -5 to -7 | F | 0 | -10 | -5 |
| (6) | 10 | 6 | 0 | F | ≤-1 | 0 | 0 | 0 | 0 | 3-5 | F | 10 | 0 | 5 |

| | Selected byte | | | | Unselected byte | | | | |
|---|---|---|---|---|---|---|---|---|---|
| | CG0 | SG0 | BL0-n | SL0 | CGm | SGm | BLi-(i+n) | SLk | TPW |
| (1) | 5 | 0 | F | -5 | -5 | -5 | F | 0 to -2 | -5 |
| (2) | 0 | 0 | F | -10 | -10 | -10 | F | -5 to -7 | -10 |
| (3) | 10 | 6 | F | 0 | 0 | 0 | F | 3-5 | 0 |

SONOS BYTE-ERASABLE EEPROM

PRIORITY

This application claims the benefit of priority based upon U.S. Provisional Patent Application having application Ser. No. 62/136,500, filed on Mar. 21, 2015, and entitled "SONOS Byte-Erasable EEPROM," and U.S. Provisional Patent Application having application Ser. No. 62/143,118, filed on Apr. 5, 2015, and entitled "SONOS Byte-Erasable EEPROM," both of which are hereby incorporated herein by reference in their entireties.

FIELD OF THE INVENTION

The exemplary embodiments of the present invention relate generally to the field of semiconductors and integrated circuits, and more specifically to memory and storage devices.

BACKGROUND OF THE INVENTION

The traditional byte-erasable EEPROM based on floating gate tunnel oxide (FLOTOX) technology has many significant drawbacks. First, the cell size is very large. Second, the floating gate requires many process steps to manufacture. Third, the operating voltage (e.g., 15V) is very high and causes the cell to have a very long channel length. Additionally, extra process steps are needed to form high voltage devices to generate the high operating voltage. Fourth, the technology is not logic-process based. It may require 7-9 extra mask layers over the logic process, which significantly increases the final chip cost for embedded memory applications.

Recently, another non-volatile memory technology based on using a charge-trapping layer, such as SONOS (Silicon-Oxide-Nitride-Oxide-Silicon) has becomes popular due to its advantages of cheaper process and logic-compatibility. Compared with the floating gate technology, the SONOS technology only requires 2-3 extra masks over the logic process and can be integrated into the standard logic process easily. This significantly reduces the chip's manufacturing cost. Therefore, SONOS is more attractive than floating gate especially in embedded memory applications.

However, typical SONOS cells are used only in flash memory (also called flash EEPROM), not EEPROM (also called 'byte-erasable' EEPROM). The flash memory erases the cells in a large block or sector size, and therefore is suitable only for storing system programs. When storing data, even one data item, flash memory operates on the entire data block, which is very slow. Therefore, flash memory may not be suitable for data storage.

For applications that require data-intensive operations, such as SIM cards, bank cards, and security cards, the data needs to be stored in 'byte-erasable' EEPROM. In this type of EEPROM, the selected byte's data is erased and then programmed with the new data. This operation requires a mechanism to prevent data errors in unselected cells due to "erase-disturb" or "program-disturb" when erasing or programming selected cells.

The memory cells of byte-erasable EEPROM are connected with word lines (WL) and bit lines (BL). During erase and program operations when high voltages are applied to the WL and BL of selected cells, the voltages may also affect unselected cells that share the same WL and BL. To prevent the unselected cells from being erased or programmed, 'inhibit' voltages are applied to the unselected WL and BL to reduce the unselected cells' electrical field, and thus prevent the unselected cells from being erased or programmed. However, even though inhibit voltages are applied, the unselected cells' data may gradually change over time as more read and program operations are performed. This is also referred to as "write-disturb."

For flash memory, a whole block's data is erased and then programmed, such that a cell's total disturb time is equal to the time to program the entire block. Therefore, the disturb time is limited. However, for byte-erasable EEPROM, because each byte can be independently erased and programmed a large number of times, for example 10,000 times, the unselected cells' disturb time will accumulate. This accumulated disturb time may result in the unselected cells' data being changed.

It is therefore desirable to have a byte-erasable EEPROM that utilizes SONOS cells and that overcomes the problems of write-disturb.

SUMMARY

In various exemplary embodiments, a novel SONOS based byte-erasable EEPROM array and associated operations are disclosed that overcome the problems of write-disturb. The cell can be manufactured using a standard CMOS logic process resulting in reduced cost for embedded memory applications.

In one aspect, an apparatus includes a plurality of SONOS memory cells forming an EEPROM memory array. The apparatus also includes a controller that generates bias voltages to program and erase the memory cells. The controller performs a refresh operation when programming selected memory cells to reduce write-disturb on unselected memory cells to prevent data loss.

In another aspect, a method is provided for operating a plurality of SONOS memory cells that form an EEPROM memory array. The SONOS memory cells being formed on a single N-well. The method includes reading original data from selected page of memory cells and loading the original data into a page buffer. The method also includes loading new data into the page buffer to overwrite the original data, and performing an erase operation on selected cells while inhibiting unselected cells. The method also includes programming the selected page of memory cells with the updated data in the page buffer to update the selected cells and refresh the unselected cells.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 3-5 shows tables that illustrate exemplary embodiments of erase bias conditions for use with the byte-erasable EEPROM array shown in FIG. 2;

FIGS. 6-10 shows tables that illustrate exemplary embodiments of program bias conditions for use with the array byte-erasable EEPROM shown in FIG. 2;

FIGS. 15-17 show exemplary embodiments of erase bias conditions using FN tunneling;

FIG. 18 shows an exemplary embodiment of program bias condition using BTBT;

FIGS. 19-20 show another exemplary embodiment of the program bias condition using 'Punch-Through-Assisted-Hot-Hole (PAHH)' injection;

FIGS. 21-22 show another exemplary embodiment of program bias condition using 'Channel-Hot-Hole-Injection (CHHI)' to inject hot holes into the cells' charge-trapping layer;

DETAILED DESCRIPTION

Exemplary embodiments of the present invention are described herein in the context of a process, device, method, and apparatus for providing a novel byte-erasable EEPROM device.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

It should be noted that the exemplary embodiments are not limited to SONOS cells only and can be applied with any other type of charge-trapping cells. To realize the low-cost, high-flexibility byte-erasable EEPROM using SONOS or other charge-trapping type of cells, the exemplary embodiments disclose a novel array and novel operating conditions. These conditions allow the array to perform byte-erase without causing erase-disturb to the unselected pages. However, for some preferred low-voltage operation conditions, the unselected bytes in the selected page may still experience erase-disturb. To solve this problem, the exemplary embodiments disclose another novel operation called 'refresh'. The refresh operation recovers the unselected bytes' data back to the original state before being disturbed. Therefore, by using the novel refresh operation the disturb problem is eliminated.

Figure 1:
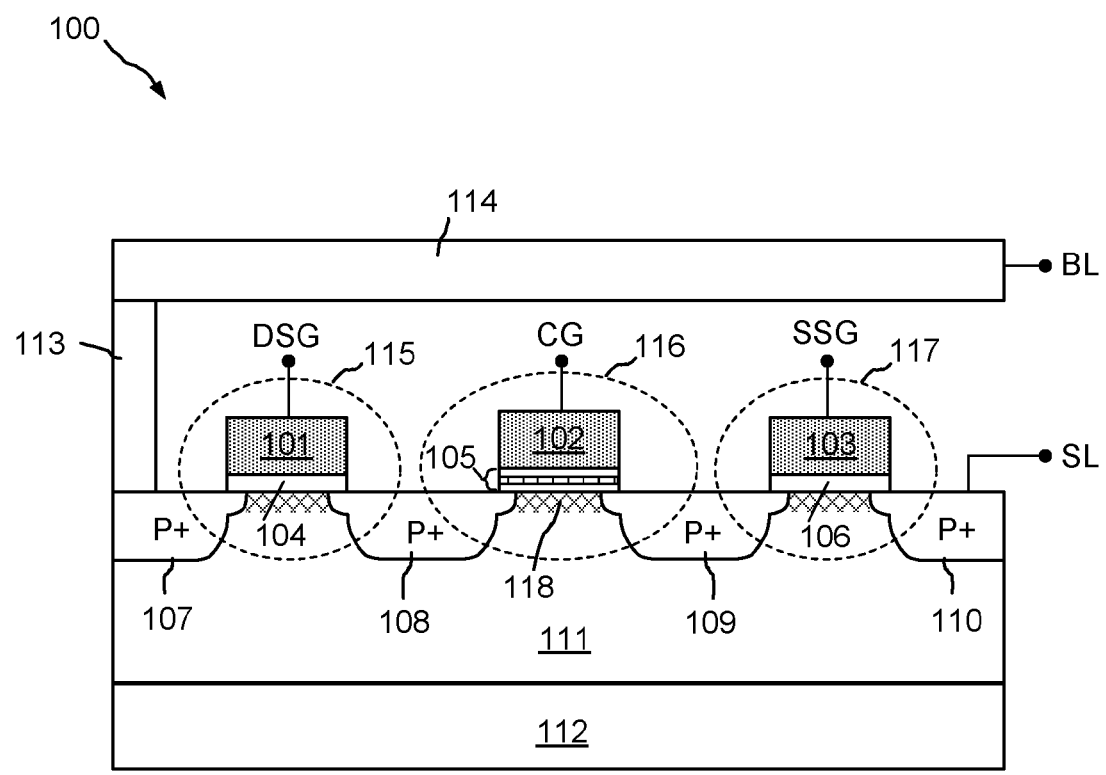
FIG. 1 shows an exemplary embodiment of a PMOS SONOS cell structure for use a byte-erasable EEPROM.

FIG. 1 shows an exemplary embodiment of a SONOS cell structure 100 for use in a byte-erasable EEPROM. The cell structure 100 includes three transistors 115, 116, and 117, and is referred to as a 3T cell structure. The three transistors have poly-gates 101, 102, and 103, respectively. The transistor 115 is a Drain-Select-Gate (DSG) transistor and the transistor 117 is the Source-Select-Gate (SSG) transistor. The transistor 116 is the storage cell that contains a charge-trapping layer 105 under the Control Gate (CG) 102 for data storage. A channel region 118 is also shown.

The gates of the transistors 115, 116, and 117 are connected to DSG, CG, and SSG signal lines, respectively. The transistor 115 includes gate oxide layer 104 and the transistor 117 includes gate oxide layer 106. The charge-trapping layer 105 comprises a suitable charge trapping material, such as ONO (Oxide-Nitride-Oxide) sandwiched layers. The bottom oxide layer of the ONO charge-trapping layer 105 is also called a "tunnel oxide." Its thickness is thin enough to allow electrons or holes to tunnel through it when a high voltage electrical field is applied. The electrons or holes will be trapped in the nitride layer of the ONO charge-trapping layer 105. The trapped electrons or holes will change the threshold voltage (Vt) of the transistor 116.

The cell structure 100 includes P-type diffusion regions 107, 108, 109, and 110. It should be noted that the exemplary embodiments may be implemented using PMOS or NMOS transistors. For the PMOS embodiment, the diffusions 107-110 have P-type doping deposited in an N-well (NW) 111 that is located in a P-substrate 112. For the NMOS embodiment, the diffusions 107-110 have N-type doping deposited in a triple P-well (TPW) 111 that is located inside a deep N-well (DNW) 112. In this case, the DNW 112 may be located in a P-substrate (not shown). A metal bit line (BL) 114 is coupled to a bit line contact 113. It should be noted that the cell structure 100 can be implemented by using a standard single-poly CMOS logic process. As such, only one extra mask for the ONO pattern-etch and one mask for deep N-well are added.

Figure 2:
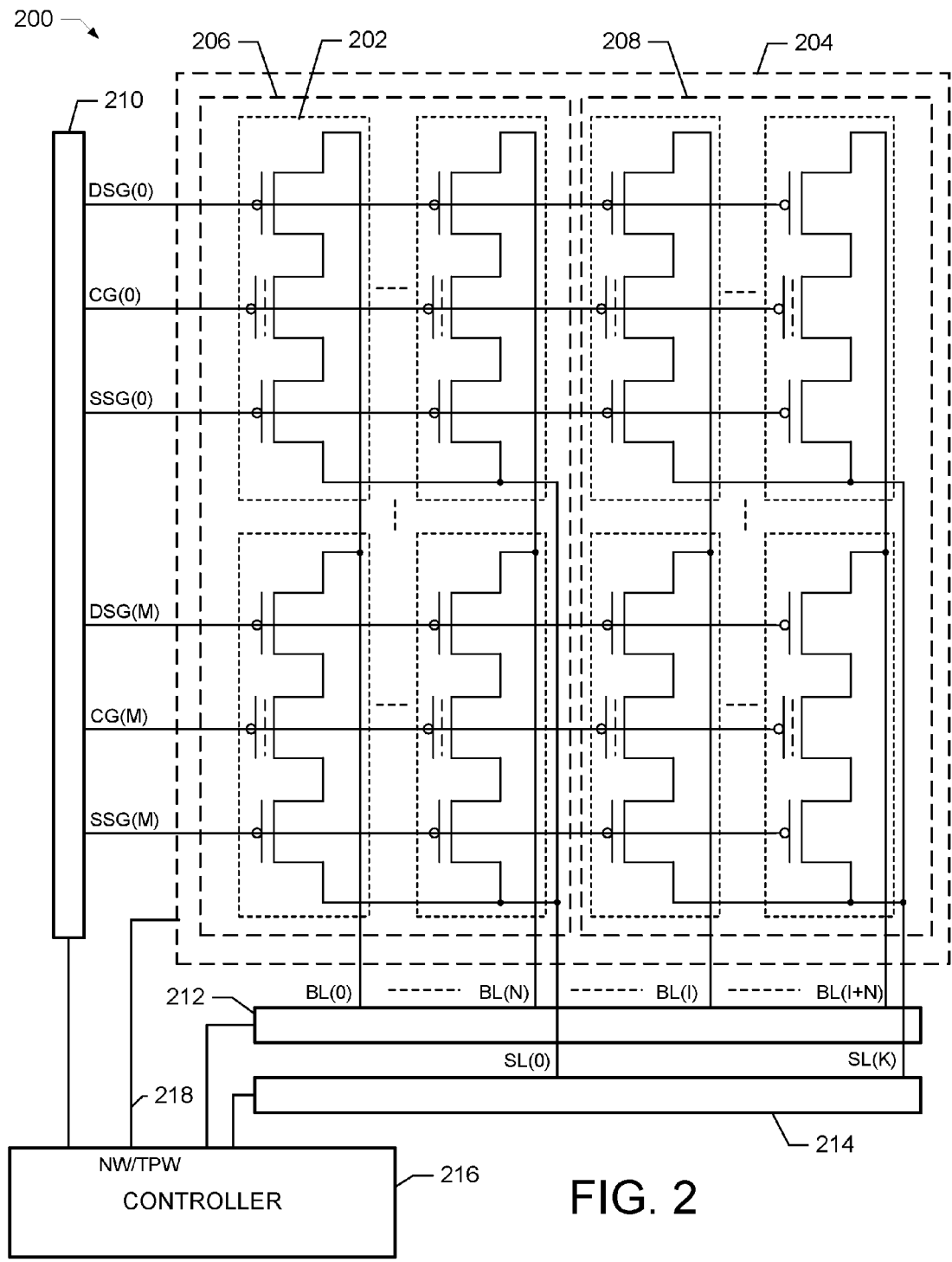
FIG. 2 shows an exemplary embodiment of a byte-erasable EEPROM array that is formed using the PMOS SONOS cell structure shown in FIG. 1.

FIG. 2 shows an exemplary embodiment of a byte-erasable EEPROM array 200 that is formed using the PMOS SONOS cell structure shown in FIG. 1. The array 200 comprises SONOS cells, such as cell 202, which can be the PMOS SONOS cell structure shown in FIG. 1. The array 200 also comprises a WL register 210, BL register 212 (or page buffer), SL register 214, and controller 216. In various exemplary embodiments, the controller 216 comprises at least one of a CPU, processor, state machine, discrete logic, ROM and/or any other suitable hardware to perform the functions described herein. In an exemplary embodiment, the controller 216 operates to read and write to the various registers to store and retrieve data from the memory cells of the array 200. The controller 216 also outputs an NW/TPW bias voltage 218 to the array.

In this embodiment, the cells are located in a common N-well (NW) 204. The N-well 204 of the array 200 is not divided into one-byte wide portions to provide for byte-erase as in conventional circuits. This aspect significantly reduces the array size. In conventional circuits the large spacing between N-well portions increases the array size. Moreover, the array's word lines, CG(0)-CG(M), do not utilize extra "Byte-Select-Transistors" (BST) for each byte to perform byte-erase. This is an important factor contributing to array size because the BSTs normally occupy 30-50% of the array size in a traditional EEPROM. Therefore, the size of the array 200 is significantly reduced when compared to conventional arrays because there is no need for BSTs.

The array 200 is divided into multiple segments as illustrated by segments 206 and 208. Each segment contains a plurality of bit lines (BL), for example, segment 206 contains BL(0-N). The number of the bit lines in a segment is determined by the erase size requirement. For the byte-erasable EEPROM, each segment may contain 8 bit lines and therefore N equals 7. The sources of the cells in a segment are connected to a source line (SL), such as illustrated by the source lines SL(0) through SL(K). Each segment may contain the same or different number of bit lines. For example, the array 200 may contain 16 segments with 8 bit lines per segment, 4 segments with 64 bit lines per segment, or 2 segments with 512 bit lines per segment. Thus, the architecture of the array 200 provides great flexibility that allows the array to be partitioned for storing different types/sizes of data, such as system parameters, program codes, and application data.

One feature provided by the novel array 200 is a byte-erase function. In accordance with the invention, the cells may use a "Fowler-Nordheim" (FN) tunneling mechanism for the erase operation. For the following discussion, it will be assumed that cells associated with CG(0), DSG(0), SSG(0), SL(0), and BL(0-7) are selected cells, and all other cells are unselected cells. For example, during the erase and program functions described below, the controller 216 operates to control the WL register 210, BL register 212, SL register 214 and the NW bias voltage 218 to enable the various bias conditions described below to program and erase the selected cells. It should be noted that in this example, the cells are operated on in bytes (selected cells), however, in other embodiments, more or less cells may be selected.

FIGS. 3-5 shows tables that illustrate exemplary embodiments of erase bias conditions for use with the array 200. For example, in an exemplary embodiment, the controller 216 operates to control the registers 210, 212, and 214 in addition to the NW bias signal 218 to produce the erase bias conditions shown in the tables of FIGS. 3-5. It should be noted that the voltages shown in the tables are exemplary and that it would be obvious to a person with skill in the art that the voltages can be adjusted within the scope of the embodiments according to different technologies and product requirements that may be used.

FIG. 3 shows an exemplary embodiment of table 300 that illustrates exemplary erase bias conditions (1-3) for use with the array 200. In the table 300, the erase and inhibit voltages for the selected byte 304 and unselected cells 306 are supplied from the corresponding select line (see 302). In condition (1), during the erase operation, the NW is supplied with a positive voltage such as 5V. For example, the controller 216 outputs the 5V NW bias voltage 218 to the NW 204. The selected CG(0) is supplied with a negative voltage such as −5V. This will turn on the selected cell's channel. The selected byte's SL0 line is supplied with a positive voltage, which is preferably the same voltage level as the NW but could be different. The selected SSG0 line is supplied with a low voltage level, such as 0V or a negative voltage, which will pass the SL0 voltage to the selected cells. This voltage will be passed to the cells' channel and induce FN tunneling to extract electrons from the cells' charge-trapping layer into their channel region. This will increase the Vt of the cells, and thus erase the cells' data to a logic '1' state.

Meanwhile, the unselected cell's SL is supplied with an inhibit voltage that is lower than the selected byte's SL0 voltage, such as 0V. This voltage will be passed to the unselected cells to reduce the electrical field between the cells' gate and channel, and thus prevent FN tunneling from happening. However, certain unselected cells will be disturbed during the erase operation due to the voltage difference between the CG0 and SL. This disturb will be accumulated for the unselected cells during repeated erase and program operations. To address this issue, a novel 'refresh' operation is performed in accordance with the invention that takes place after the erase operation to eliminate the erase-disturb effects. The details of the refresh operation are disclosed in greater detail below.

The selected DSG0 is supplied with a positive voltage such as 5V to prevent the voltages on the SL0 and SL from being passed to the BL(0-7) signal lines. The unselected CG is supplied with a positive voltage, preferably the same as on the NW, such as 5V. The unselected DSG and SSG are supplied with a positive voltage such as 5V to turn off the select gates. The unselected cells gate, drain, source, and N-well are all 5V, thus there is no erase-disturb.

It should be noted that one advantage of the condition (1) bias voltages is that the voltages are all approximately 5V. Therefore, the voltages can be supplied from a 5V device that is normally available in the standard logic process. For example, 5V is available for the Input and Output (I/O) buffer of the device. Therefore, no extra high-voltage (HV) device is needed for this embodiment and thus no extra mask or process steps are needed to create a HV device.

Condition (2) shows another exemplary embodiment of erase bias conditions for use with the array 200. In condition (2), the SL of the unselected cells 306 is supplied with a negative voltage, such as −1V to −5V. The SSG0 is supplied with a negative voltage sufficiently low to pass the SL voltage to the unselected cells. This will reduce the erase-disturb of the unselected cells. If the same voltage of CG0 is applied to SL, the erase-disturb will be completely eliminated. However, this embodiment uses a higher device junction breakdown voltage. For example, if the NW is supplied with 5V and the SL is supplied with −5V, then a junction breakdown voltage of 10V should be used. This may require extra masks and process steps to achieve the higher device junction breakdown voltage.

Condition (3) shows another exemplary embodiment of erase bias conditions for use with the array 200. In condition (3), the bias voltages comprise only positive voltages. The advantage of this embodiment is that it does not require negative-voltage pump circuitry, and a triple-P-well for NMOS to pass the negative voltage. Another advantage of this embodiment is that the unselected cell's gate and NW are supplied with the same voltage, such as 10V, and thus the embodiment does not have erase-disturb issues. However, the embodiment uses voltages higher than 5V. Thus, this embodiment uses HV devices that may increase the masks and process steps.

FIG. 4 shows an exemplary embodiment of table 400 that illustrates exemplary erase bias conditions (4-6) for use with the array 200. In this embodiment, the erase and inhibit voltages for the selected byte 404 and unselected cells 406 are supplied from the bit line (see 402). These conditions are similar to the conditions shown in the table 300 of FIG. 3 except that the SSG0 is turned off and DSG0 is turned on and the erase and inhibit voltages are supplied from the selected BL(0-7) and unselected BL signal lines rather than from SL0 and SL.

FIG. 5 shows an exemplary embodiment of table 500 that illustrates exemplary erase bias conditions (7-9) for use with the array 200. In this embodiment, the erase and inhibit voltages for the selected byte 504 and unselected cells 506 are supplied from both the BL and SL (see 502). These conditions are similar to the conditions shown in table 300 of FIG. 3 except that both the DSG0 and SSG0 are turned on, and the erase and inhibit voltages are supplied from both the selected BL(0-7) and the unselected BL and SL0-SL. They can be also supplied from the selected BL(0-7) and the unselected BL and leaving SL0-SL floating. The erase and inhibit voltages can also be supplied from SL0-SL and leaving the selected BL(0-7) and the unselected BL floating.

It should be noted that only the conditions (1), (4), and (7) have erase-disturb effects on the unselected bytes of the selected CG0. During all other conditions, the unselected cells associated with CG do not have any erase-disturb effects.

FIGS. 6-10 shows tables that illustrate exemplary embodiments of program bias conditions for use with the array 200. For example, after the erase operation is completed, the program operation takes place to program new data into the selected cells. The program and inhibit voltages are applied to the selected and unselected BLs, respectively. For example, in an exemplary embodiment, the controller 216 operates to control the registers 210, 212, and 214 in addition to the NW bias signal 218 to produce the erase bias conditions shown in the tables of FIGS. 6-10. It should be noted that the voltages shown in the tables are exemplary and that it would be obvious to a person with skill in the art that the voltages can be adjusted within the scope of the embodiments according to different technologies and product requirements that may be used.

FIG. 6 shows an exemplary embodiment of table 600 that illustrates exemplary program bias conditions (10-12) for use with the array 200. In this embodiment, the cell is programmed by using "Band-To-Band-Tunneling" (BTBT) injection (see 602). In condition (10), the CG0 of the selected byte 604 is supplied with a positive voltage, such as 5-7V. This will turn off the cells' channel. The NW is supplied with a positive voltage such as 5V. The selected BLs are supplied with a low voltage such as 0V or −1V or any other negative voltage. The selected DSG0 line is supplied with a low voltage such as 0V or negative voltage to pass the BL voltage to the drain of the selected cells. The voltages between the drain and the N-well are selected to be sufficient to induce BTBT to occur in the drain junction. This will cause impact-ionization to generate many electron-hole pairs. The electrons will be attracted by the CG0's positive voltage and injected into the cells' charge-trapping layer. This will increase the cells' Vt and thus program the cells' data to '0'.

The BLs of the unselected cells 606 are supplied with a positive voltage which is preferably the same as the NW voltage. This will prevent BTBT from happening and thus the unselected cells will not be programmed. Because the unselected cells' gate, drain, and N-well are supplied with the same voltage, the cells will not be disturbed.

For unselected cells, the CG and the DSG lines are supplied with a positive voltage preferably equal or higher than the selected cell's BL's voltage. This will turn off the DSG so that the BL voltage on the unselected cells will not be passed to the cells to program them. The unselected CG are supplied with the same voltage as the well, and therefore the cells will not be disturbed. In another exemplary embodiment, the unselected CG can be floating, and thus will be coupled to approximately the same voltage by the N-well. It should be noted that this condition can be applied to all the other embodiments of the erase and program conditions. For simplicity, a description will not be repeated for each embodiment. One advantage of this bias condition is its extremely low program current's requirement. Because the cells are turned off, each cell only requires about 10 pA to 1 nA to program, and thus the pump circuit's size can be minimized. This may be important especially for low density products, in that the pump circuitry's size might be even larger than the memory array.

Condition (11) is similar to the condition (10) except that it only requires 0V and negative voltages such as −5V. This allows the chip to contain only one negative charge pump circuit. The negative charge pump can be implemented by using a standard logic process with PMOS in N-well, or with NMOS in triple P-well inside deep N-well.

Condition (12) is also similar to condition (10) except that it uses both positive and negative voltages such as 3V and −3V. This allows the chip to supply 3V directly from VDD instead of from a 5V charge pump circuit. Therefore, this condition only requires a negative charge pump circuit. Because it only requires −3V rather than −5V, the size of the negative charge pump circuit can be reduced.

FIG. 7 shows an exemplary embodiment of table 700 that illustrates exemplary program bias conditions (13-15) for use with the array 200. In these program bias conditions, the cell is programmed by using "Punch-Through-Assisted-Hot-Electron" (PAHE) injection (see 702). The bias conditions in the table 700 are similar to the previous BTBT embodiment shown in table 600 of FIG. 6, except that the selected SSG0 line is supplied with a low voltage to turn on the SSG0. The SL0 is supplied with a positive voltage preferably the same as the NW. This voltage will be passed to the selected cells' source junction. If the voltage is sufficient, it will cause the cells' channel to be punched through. The punch-through current will accelerate the electrons generated by BTBT in the drain junction to become "hot electrons." This will increase the efficiency of the electron injection and thus greatly reduce the program time. This mechanism is referred to as PAHE injection. The punch-though current can be controlled by the gate voltage of the SSG0 to prevent it from overloading the pump circuitry. The typical program current for each cell is approximately 100 nA to 10 uA. Similar to FIG. 6, this embodiment can be implemented by using positive voltage, negative voltage, or both positive and negative voltages as shown in conditions (13), (14), and (15), respectively.

FIG. 8 shows an exemplary embodiment of table 800 that illustrates exemplary program bias conditions (16-18) for use with the array 200. In these program bias conditions, the cell is programmed by using "Punch-Through-Assisted-Hot-Electron" (PAHE) injection (see 802). These bias conditions are similar to the bias conditions shown in table 700 of FIG. 7, except that the bias conditions of BL and SL are swapped. The DSG0 and SSG0's conditions are also swapped accordingly. The selected 804 cells' source is applied with a low voltage such as 0V. This causes the selected cells' impact ionization to occur in the source junction rather than the drain junction. For the selected cells, the BL is supplied with a positive voltage such as 5V. This voltage will punch through the cells' channel, and thus accelerate the electrons and cause them to inject into the cell's charge-trapping layer. For the unselected 806 cells, since their source is also supplied with 0V, there also will be impact ionization occurring in their source junction. However, because their BL is supplied with a low voltage such as 0V, it will not punch through the cell channel, and thus the electrons in the source junction will not get acceleration. As a result, the unselected cells will not get programmed. Similar to FIG. 6, this embodiment can be implemented by using positive voltage, negative voltage, or both positive and negative voltages as shown in conditions (16), (17), and (18), respectively.

FIG. 9 shows an exemplary embodiment of table 900 that illustrates exemplary program bias conditions (19-21) for use with the array 200. In these bias conditions, the cell is programmed by using 'Channel-Hot-Electron (CHE)' injection (see 902). In condition (19), the NW is supplied with a positive voltage such as 5V. The selected 904 BLs are applied with a low voltage such as 0V or negative voltage. The selected DSG0 is supplied with a low voltage such as 0V or negative voltage to pass the BL voltages to the selected cells' drain junction. The voltage difference between the drain and the N-well should be sufficient to cause impact-ionization to occur in the drain junction. This will generate many electron-hole pairs near the drain junction. The selected SL0 is supplied with a positive voltage preferably the same as the NW voltage. The SSG0 line is supplied with a low voltage to pass the SL0's voltage to the cells' source. The CG0 is supplied with a positive voltage lower than the SL0's voltage. This voltage should be sufficiently low to turn on the cells' channel, and thus cause channel current flowing from the source to the drain. This will accelerate the electrons near the drain junction and inject them into the cells' charge-trapping layer due to the positive voltage of the CG0. This mechanism is referred to as CHE injection. This mechanism's program efficiency is much higher, thus the cells' program time can be significantly reduced to the range of 5 us-50 us. However, there is a higher channel current of approximately 100 uA to 500 uA per cell, and thus results in a much larger pump circuit to generate the program current. Also notice, the cells' channel current can be controlled by the CG0 in order to not over-load the pump circuit. Similar to FIG. 6, this embodiment can be implemented by using positive voltage, negative voltage, or both positive and negative voltages as shown in conditions (19), (20), and (21), respectively.

FIG. 10 shows an exemplary embodiment of table 1000 that illustrates exemplary program bias conditions (22-24) for use with the array 200. This embodiment is similar to the embodiment of FIG. 9, except the bias conditions of BL and SL are swapped. The DSG0 and SSG0's conditions are also swapped accordingly. This causes the selected 1002 cells' impact ionization to occur in the source junction rather than the drain junction. The channel current flows from the drain to the source and accelerates the electrons. The electrons are injected into the cells' charge-trapping layer from the source side rather than the drain side. Similar to FIG. 6, this embodiment can be implemented by using positive voltage, negative voltage, or both positive and negative voltages as shown in conditions (22), (23), and (24), respectively.

It should be noted that according to the above program conditions (13)-(15), the electrons are injected near the drain junction, and according to the program conditions (16)-(18) the electrons are injected near the source junction. Since the electrons stored in the charge-trapping layer will not migrate if the channel length is sufficient, in accordance with another exemplary embodiment of the invention, the conditions (13)-(15) and (16)-(18) can be used to program two data bits; one in the charge-trapping layer near the drain junction and one in the charge-trapping layer near the source junction. In this way, one cell can store two bits of data, thus doubling the capacity of the array.

Similarly, the above program conditions (19)-(21) inject electrons near the source junction, and the program conditions (22)-(24) inject electrons near the drain junction. Therefore, in accordance with another exemplary embodiment of the invention, the conditions (19)-(21) and (22)-(24) can be used to program two data bits in the charge-trapping layer; one data bit near the source junction and one data bit near the drain junction.

It should also be noted that under some erase conditions, such as conditions (1), (4), and (7), although the unselected bytes' SL or BL are supplied with the inhibit voltage, due to the voltages are not being completely the same as the CG0's voltage, the unselected cells may still be disturbed. This will cause electrons to gradually tunneling from the cells' charge-trapping layer to the channel region, and thus gradually increases the programmed cells' Vt. Repeatedly erasing and programming some bytes will accumulatively disturb the unselected bytes and eventually causes the unselected bytes' programmed cells to become erased and result in data failure.

In an exemplary embodiment, an operation referred to as "refresh" is used to address the erasing of data due to accumulative erase-disturb. Because the erase-disturb causes the unselected programmed cells' charge-trapping layer to lose electrons, the refresh operation is used to inject electrons back into the charge-trapping layer of the unselected programmed cells. This returns the cells' Vt back to the originally programmed value, and thus the erase-disturb effect is eliminated. As a result, the byte-erase operation can be repeatedly performed without causing accumulative erase-disturb to the unselected cells. A byte-erasable EEPROM can then be realized.

Figure 11:
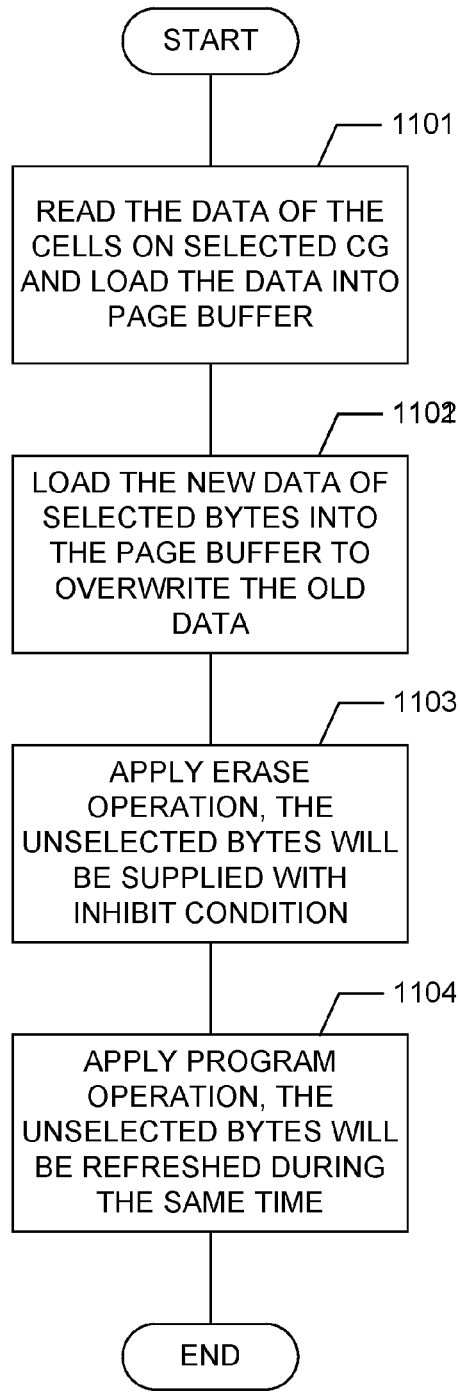
FIG. 11 shows an exemplary embodiment of a method for providing refresh operations for use with the byte-erasable EEPROM shown in FIG. 2.

FIG. 11 shows an exemplary embodiment of a method 1100 for providing refresh operations for use with a memory array. For example, the method 1100 is suitable for use with the array 200 shown in FIG. 2. In various exemplary embodiments, the controller 216 controls the WL register 210, BL register 212, SL register 214 and NW bias signal 218 to perform the functions described below.

At block 1101, data from a selected memory page is read from the cells and then loaded into a page buffer. In an exemplary embodiment, each byte of the page buffer contains a 'flag-latch' or 'byte-latch' (not shown in FIG. 2) that indicates if the byte is selected, and multiple (i.e. eight) data latches that store the new data to be programmed.

At block 1102, the new data for the selected bytes are loaded into the page buffer to overwrite the old data. Meanwhile, the byte-latches of the selected bytes are set. Thus, the selected and unselected bytes can be distinguished by the byte-latches.

At block 1103, the erase operation is applied to the selected page. The page buffer will apply the erase voltage to the selected bytes and the inhibit voltage to the unselected bytes. This will erase the selected bytes while the unselected bytes are disturbed.

At block 1104, a program operation takes place to program the data of the page buffer into the selected page. For the selected bytes, since the cells' data has been erased, the new data is programmed into the cells as the normal program operation. For the unselected bytes, the data is still in the cells, thus the program will just inject more electrons back to the cells to compensate for the electrons lost during the erase-disturb. This returns the cells back to the original Vt of the program state, and thus "refreshes" these cells. In this exemplary embodiment, the refresh is done at the same time with the program of the selected bytes. Thus, no extra time is needed for the refresh operation.

It should be noted that there are several embodiments that may be used to implement the data-loading sequence in the method 1100. For example, in another exemplary embodiment, the operations at blocks 1101 and 1102 are swapped. Thus, the new data for the selected bytes are loaded into the page buffer first, and then the data of the unselected bytes are read from the cells and loaded to the page buffer. For the selected bytes, the data in the cells will not be loaded into the page buffer. Thus, the page buffer keeps the new data for the selected bytes and the original data for the unselected bytes.

In another exemplary embodiment, the operation at block 1102 can be moved to occur after the erase operation at block 1103. Thus, the unselected bytes' data is read from the cells to the page buffer after the erase operation. Because the unselected bytes' data shall not be changed after just one erase-disturb, the cells' data shall be read correctly. Similarly, only the unselected bytes' data will be read and loaded to the page buffer. The selected bytes' cells will not be re-loaded so the page buffer will keep the new data to be programmed.

In various exemplary embodiments, the refresh operation may be implemented in several ways. For example, the refresh operation's program pulse may be shorter or the program voltage can be lower than the normal program operation. This is used to prevent the unselected bytes' cells from being 'over-programmed'. Because the unselected cells are repeatedly programmed by each refresh operation, eventually the cells Vt might become too low. If this occurs, it may be difficult to bring the cell's Vt back to the erase state by the next erase operation. Therefore, it is preferable to apply a shorter or weaker program pulse to the unselected cells. Because the erase-disturb only removes a small amount of electrons from the cells' charge-trapping layer, it can be recovered by a shorter or weaker program pulse.

In another exemplary embodiment, during the program operation, after a predetermined time, the unselected bytes' page buffer will be reset. Thus, the page buffer will no longer apply the program voltage to the unselected cells. Instead, it will apply the inhibit voltage to the unselected cells. Meanwhile, the selected cells will keep on programming until the program time ends. In this way, the unselected cells are programmed by a shorter pulse.

In another exemplary embodiment, the page buffer may apply different program voltage to the unselected bytes to 'weakly' program the cells. This will prevent the unselected cells from being over-programmed. For example, for the program condition (10) shown in FIG. 6, the selected cells' BL are supplied with the program voltage 0V. For the refresh operation, the BL of the programmed cells on the unselected bytes may be supplied with 1-2V for example. This will reduce the program efficiency of the unselected bytes' cells.

In another exemplary embodiment, the refresh operation may have different CG voltage from the program operation to 'weakly' program the cells. This will prevent the unselected cells from being over-programmed. For example, for the program condition (10) shown in FIG. 6, the selected CG0 is supplied with the program voltage 5-7V. For the refresh operation, the CG0's voltage may be reduced to 3-5V. This will reduce the program efficiency of the unselected bytes' cells.

Figure 12:
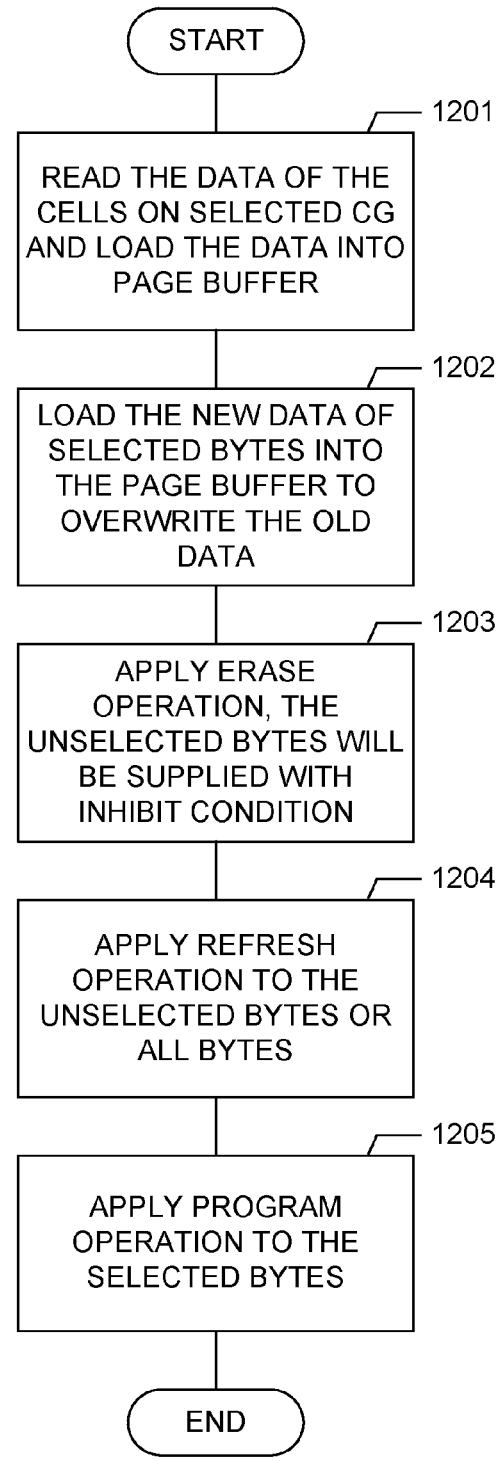
FIG. 12 shows an exemplary embodiment of a method for providing refresh operations for use with the byte-erasable EEPROM shown in FIG. 2.

FIG. 12 shows an exemplary embodiment of a method 1200 for providing refresh operations for use with a memory array. For example, the method 1200 is suitable for use with the array 200 shown in FIG. 2. The refresh operation provided by the method 1200 may be performed independently, before, or after the program operation of the selected bytes.

At block 1201, data from a selected memory page is read from the cells and then loaded into a page buffer. In an exemplary embodiment, each byte of the page buffer contains a 'flag-latch' or 'byte-latch' that indicates if the byte is selected, and multiple (i.e. eight) data latches that store the new data to be programmed.

At block 1202, the new data for the selected bytes are loaded into the page buffer to overwrite the old data. Meanwhile, the byte-latches of the selected bytes are set. Thus the selected and unselected bytes can be distinguished by the byte-latches.

At block 1203, the erase operation is applied to the selected page. The page buffer will apply the erase voltage to the selected bytes and the inhibit voltage to the unselected bytes. This will erase the selected bytes while the unselected bytes are disturbed.

At block 1204, a refresh operation is performed as describe above.

At block 1205, a program operation is performed as described above.

In the method 1200, the refresh operation 1204 is applied before the program operation 1205. The refresh operation may have a shorter program pulse or a different program voltage to weakly program the unselected bytes' programmed cells. The refresh operation's program pulse may only be applied to the unselected bytes' program cells, or may be applied to both the selected bytes and unselected bytes' program cells. This will not affect the selected bytes because these cells need to be programmed anyway. After the refresh operation, the page buffer of the unselected bytes' data may be reset, thus the unselected bytes will not be programmed by the following program operation. The program operation is only applied to the selected bytes.

In another exemplary embodiment, the refresh operation at block 1204 is performed after the program operation at block 1205. In this embodiment, the program operation will only program the cells in the selected bytes. The unselected bytes are supplied with the inhibit voltage during the programming. After the program operation, the refresh operation is applied to only the unselected bytes or both the selected and unselected bytes. The refresh operation may use a shorter program pulse or different voltages from the program operation.

Figure 13:
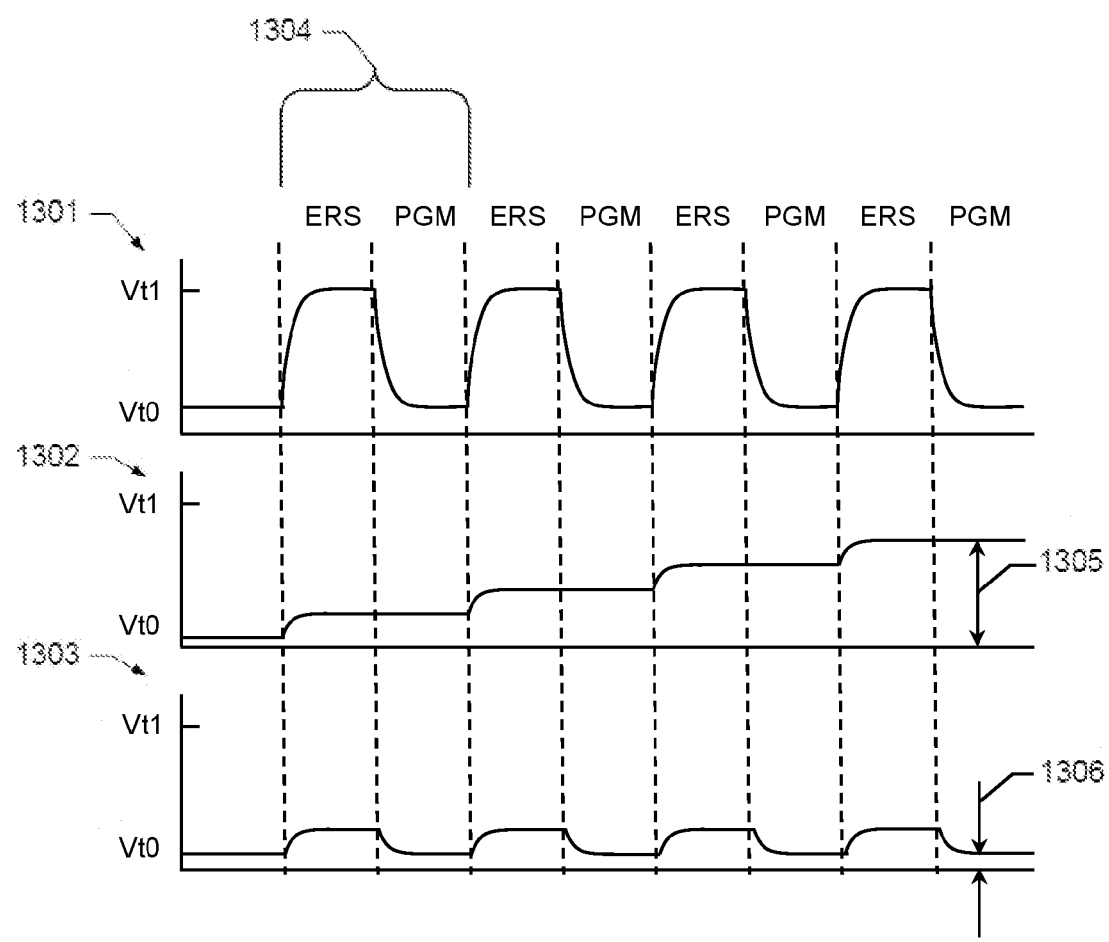
FIG. 13 shows exemplary graphs that compares the Vt of cells with and without the exemplary refresh operations during repeated erase and program cycles.

FIG. 13 shows exemplary graphs that compare the Vt of the cells with and without the refresh operation during repeated erase and program cycles. The graph 1301 shows the Vt of a selected cell during a plurality of erase and program cycles 1304. The selected cells Vt is increased to Vt1 by each erase (ERS) operation and decreased to Vt0 by each program (PGM) operation.

The graph 1302 shows the Vt of a programmed cell located in an unselected byte that does not experience the refresh operation. As illustrated in graph 1302, the Vt of the unselected cell will be gradually increased by the disturb of each erase operation. Eventually, the Vt of the unselected cell may exceed an acceptable range, which results in data failure. For example, as illustrated in the graph 1302, by the four erase and program cycle, the Vt has increased to a voltage level (indicated at 1305) that may exceed the acceptable range and thus result in data failure.

The graph 1303 shows the Vt of a programmed cell located in an unselected byte that does experience the refresh operation. The Vt of the unselected cell will be increased by the disturb of each erase operation, and then decreased by the refresh operation. In this way, the erase-disturb increase of the Vt will not accumulate by the repeated erase and program cycles. Instead the refresh operation works to return the Vt to its original level, and thus the erase-disturb problem is eliminated.

It should be noted that the disclosed refresh operation is advantageous for not only eliminating the erase-disturb effects, but also guaranteeing the unselected bytes' data from being lost. Because the data of the unselected bytes are read from the cells and stored in the page buffer, if any byte's data accidentally gets erased during the erase operation, the old data still can be programmed from the page buffer. This increases the data integrity of the array. To implement this function, according to another exemplary embodiment of the invention, after the erase operation, the data of the unselected bytes' cells may be read and compared with the data stored in the page buffer before the erase operation. If the data is different, that means the unselected cells' data has changed during the erase operation. The data stored in the page buffer will be programmed back to the unselected cells. In this way, the cells' data will be recovered.

It should be also noted that the disclosed byte-erase and refresh operation is better than the approach where a page-erase is performed and then the unselected bytes' data is programmed back to the cells. Because for the page-erase approach, every time some bytes are erased, the entire page has to be erased. Thus, the unselected cells' endurance cycles are significantly reduced. In contrast, the disclosed byte-erase and refresh operation only removes and adds a small amount of electrons from and to the cells. Therefore, the endurance cycles will not be significantly affected.

To read the unselected cells' data for loading the page buffer, according to one embodiment of the invention, the sensing circuits of the normal read operation are used. The data can be read in units of bit, or byte, or multiple bytes, depending on the number of sensing circuits. The data is read and loaded to the program page buffer for the refresh operation.

In another exemplary embodiment, the unselected cells can be read by using another operation called a "parallel-read" operation where the selected CG is supplied with a voltage that is between the Vt of an on-cell and an off-cell. The source line is supplied with a voltage, such as VDD for PMOS cells, or 0V for NMOS cells. For on-cells, the cells will be turned on to flow a channel current and pass the SL voltage to the BL. For off-cells, they will not conduct current or pass the SL voltage to the BL. As a result, the page buffer can be set to data 0 or 1 according to the current or voltage of the BL. This operation can be applied to partial set or all of the BL simultaneously, thus reducing the time to read the unselected cells' data.

Figure 14:
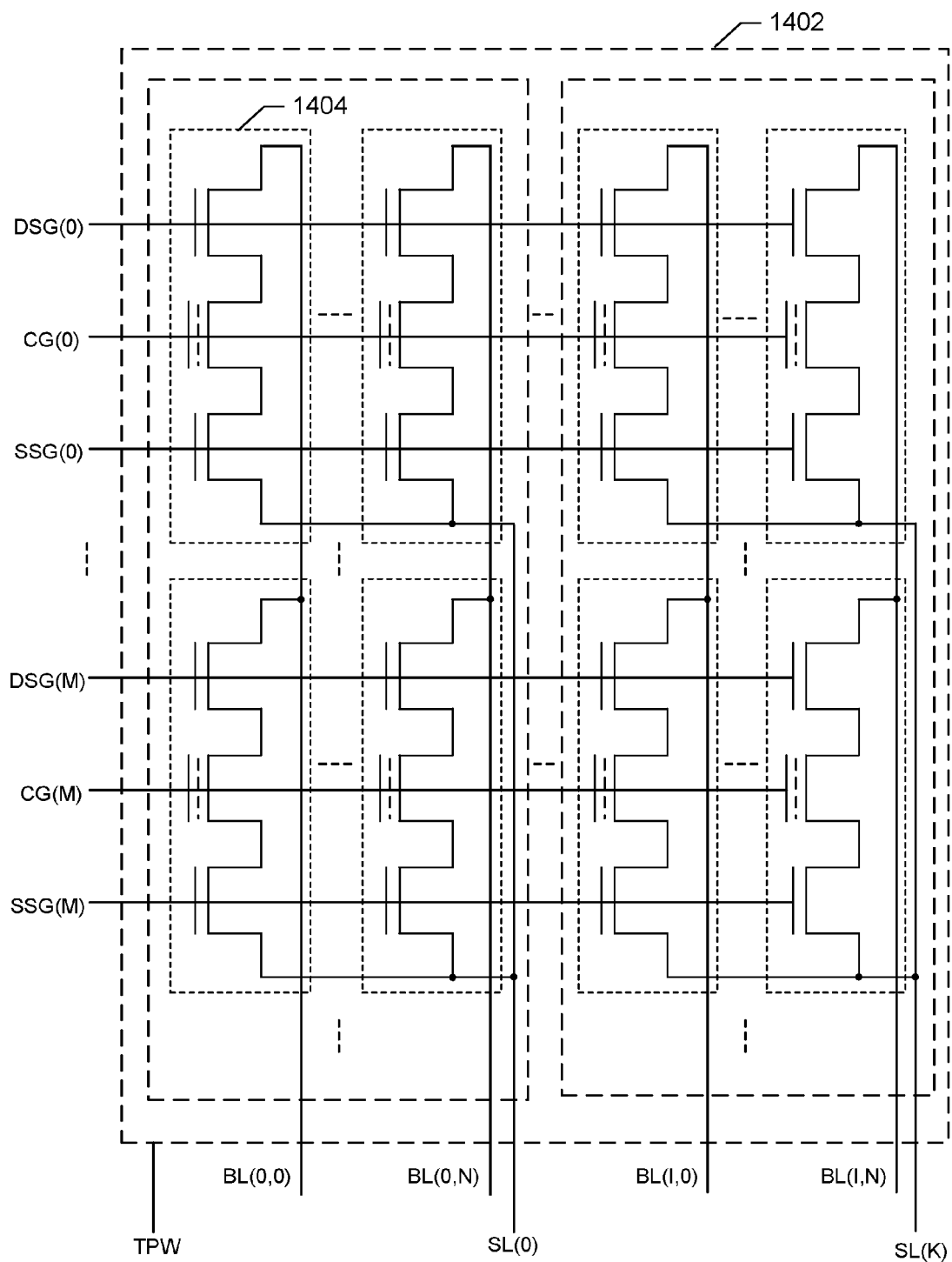
FIG. 14 shows an exemplary embodiment of a byte-erasable EEPROM using NMOS SONOS cells in accordance with the invention.

FIG. 14 shows an exemplary embodiment of a memory array using NMOS cells in accordance with the invention. For clarity, the controller 216 and associated registers 210, 212, 214 are not shown in FIG. 14. The NMOS cells (e.g., cell 1404) are located in a common triple P-well (TPW) 1402. In this embodiment, the TPW 1402 is not divided into one-byte width portions to facilitate a byte-erase operation. Instead, the TPW 1402 is a single structure onto which the cells are deposited. This significantly reduces the array size because there is no division of the TPW 1402. Moreover, the array's control gate lines, CG(0)-CG(M), do not need extra 'Byte-Select-Transistor (BST)' for each byte to perform a byte-erase function. Therefore, the array size is significantly reduced. The TPW 1402 may be located inside a deep N-well (DNW) in the P-substrate. In an exemplary embodiment, the DNW is supplied with a voltage equal or higher than the voltage on the TPW 1402 to prevent forward current.

The erase and program operations of an NMOS embodiment of the array shown in FIG. 14 are similar to the previously described PMOS embodiment. However, the polarity of the voltages may need to be reversed according to the different structures of PMOS and NMOS devices that are used.

FIGS. 15-17 show exemplary embodiments of erase bias conditions (1-9) for the NMOS array shown in FIG. 14 using FN tunneling. It should be noted that unlike the PMOS embodiment's erase conditions shown in FIGS. 3-5 that extract electrons from the cells' charge-trapping layer, in the NMOS embodiment shown in FIG. 14, electrons are injected into the cells' charge-trapping layer using FN tunneling.

This will increase the cells' Vt and thus make the cells become off-cells after the erase operation.

FIG. 18 shows an exemplary embodiment of program bias conditions (1-3) using BTBT. Please notice, unlike the PMOS bias conditions shown in FIG. 6 that inject electrons into the cells' charge-trapping layer, in this NMOS embodiment, holes are injected into the charge-trapping layer due to the negative biased CG voltage. The holes will neutralize the electrons stored in the charge-trapping layer, and thus decreases the cell's Vt. The cells become an on-cell after programming.

FIGS. 19-20 show another exemplary embodiment of the program bias condition (1-9) using 'Punch-Through-Assisted-Hot-Hole (PAHH)' injection. Please notice, unlike the PMOS bias conditions shown in FIGS. 7-8 that use PAHE to inject hot electrons into the cells' charge-trapping layer, in this NMOS embodiment, hot holes are injected into the charge-trapping layer due to the negative biased CG voltage.

FIGS. 21-22 show another exemplary embodiment of program bias conditions (10-15) using 'Channel-Hot-Hole-Injection (CHHI)' to inject hot holes into the cells' charge-trapping layer, instead of injecting electrons as in the PMOS bias conditions shown in FIGS. 9-10.

Therefore, in various exemplary embodiments, the disclosed byte-erasable EEPROM has the following several advantages over the conventional memories.

1. The cells are based on a logic process and therefore only utilize an increase of 2 to 3 mask layers for deep N-well formation and ONO region in the array area.
2. The array does not require divided wells for each byte and therefore this greatly reduces the array size.
3. The array does not require Byte-Select-Gate transistors for the gate of each byte and therefore this greatly reduces the array size.
4. The erase and program operations only require approximately +5 voltage and therefore these voltages can be supplied from 5V devices, such as available I/O devices. Therefore, the array does not require HV devices, which reduces the number of mask layers and process steps, and therefore saves manufacturing costs.
5. The operations using FN tunneling and BTBT injection require extremely low current, and therefore are suitable for low power applications. These embodiments also utilize much smaller pump circuitry than convention devices.
6. Both the erase and program operations inject electrons instead holes, and therefore prevent the cells' gate oxide from damage by holes and increases the reliability and endurance cycles.

Figure 23:
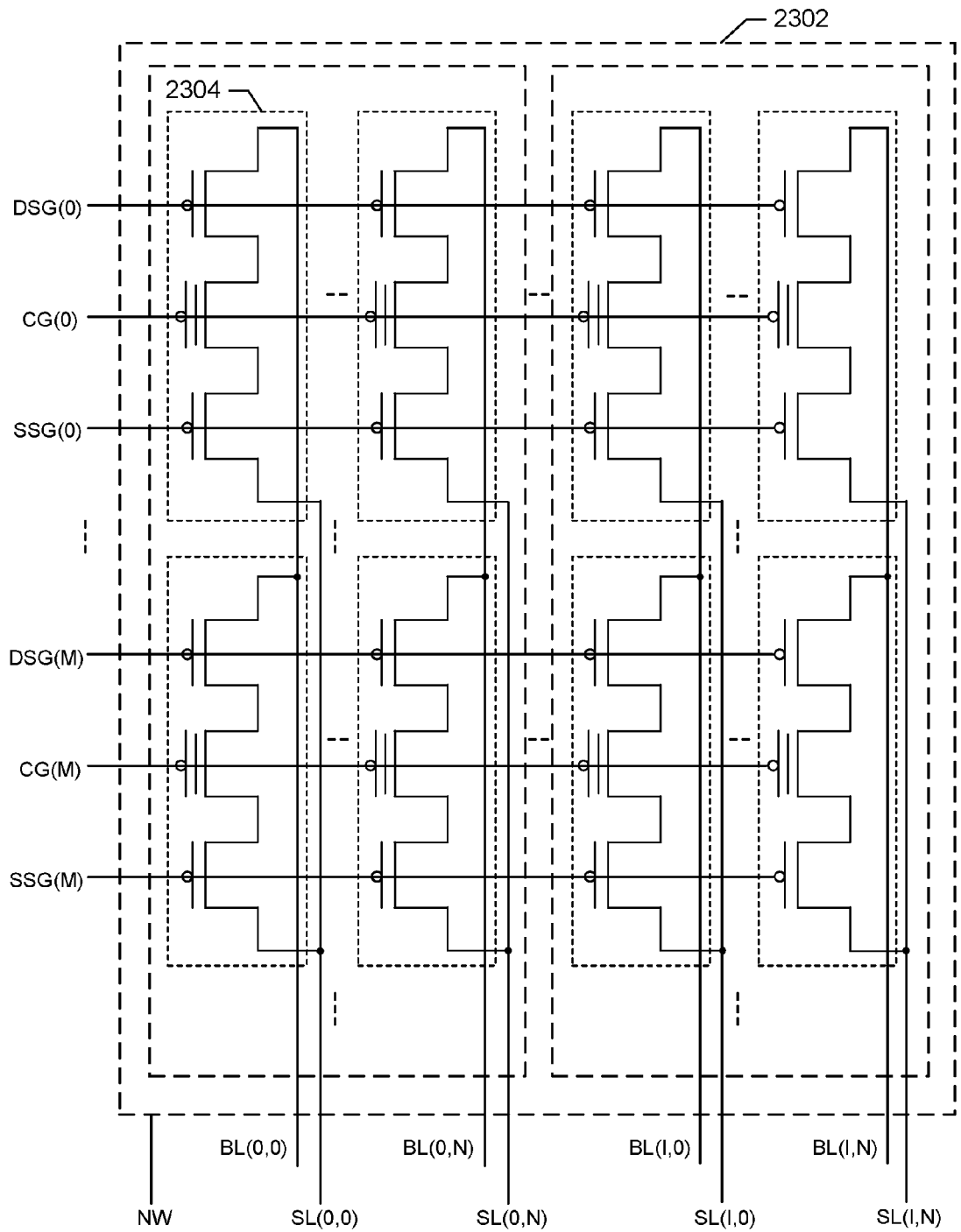
FIGS. 23-24 show exemplary embodiments of PMOS and NMOS arrays constructed in accordance with the invention.
Figure 24:
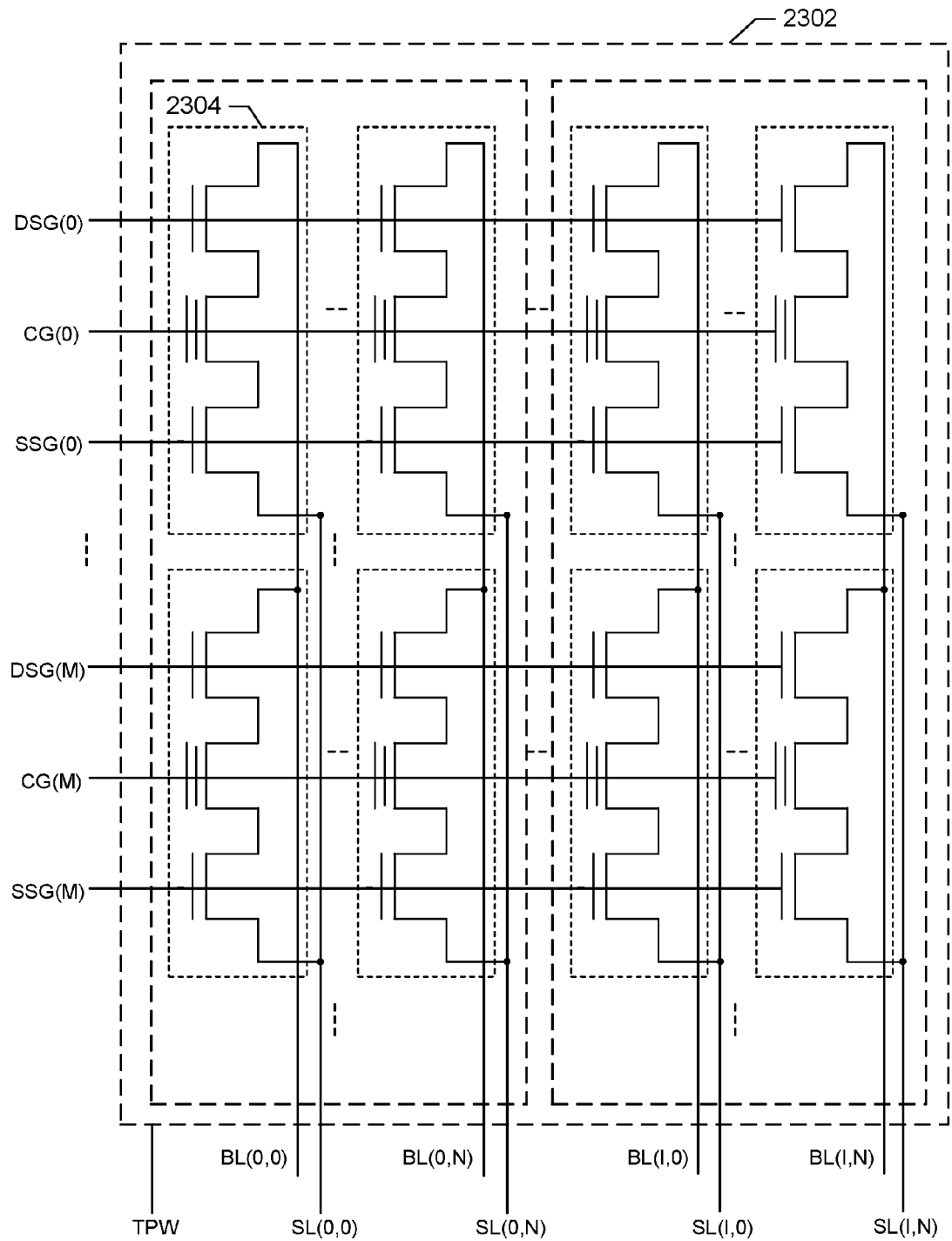

FIGS. 23-24 show exemplary embodiments of PMOS and NMOS arrays that utilize floating gate cells in accordance with the invention. FIG. 23 shows the PMOS array and FIG. 24 shows the NMOS array. In these embodiments, the cells' BL and SL are both running parallel in the vertical direction. These are also referred as being "AND" arrays. This array's basic operations are the same as a "NOR" array, except that during erase and program operation, if the BL's voltage punches through the cells' channel, it will not pass to the SL of the adjacent cells. However, in these embodiments the cell's size becomes double because the double number of metal BL and SL causes double cell pitch.

Figure 25:
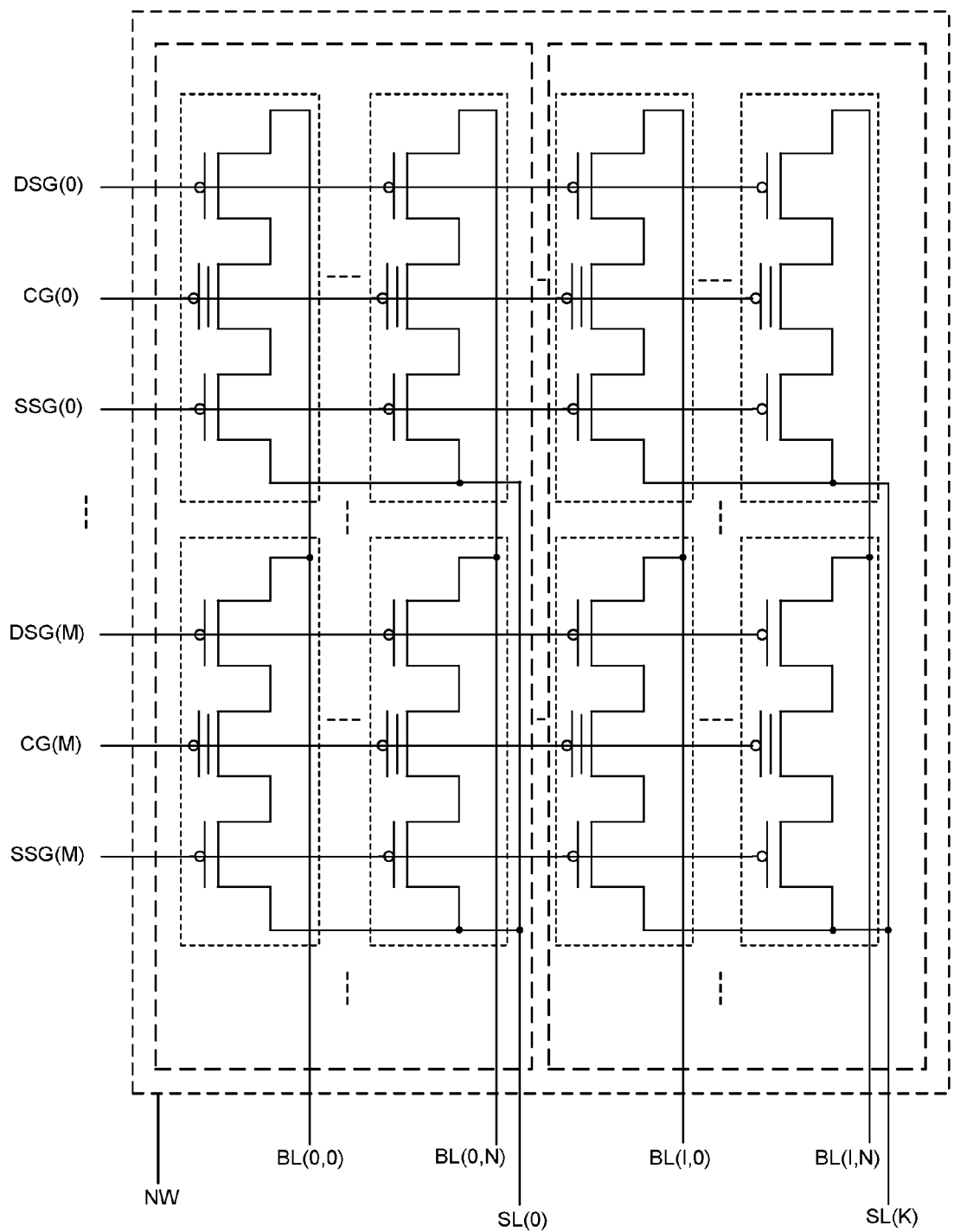
FIG. 25 shows an exemplary embodiment of the array implemented with floating gate PMOS cell.
Figure 26:
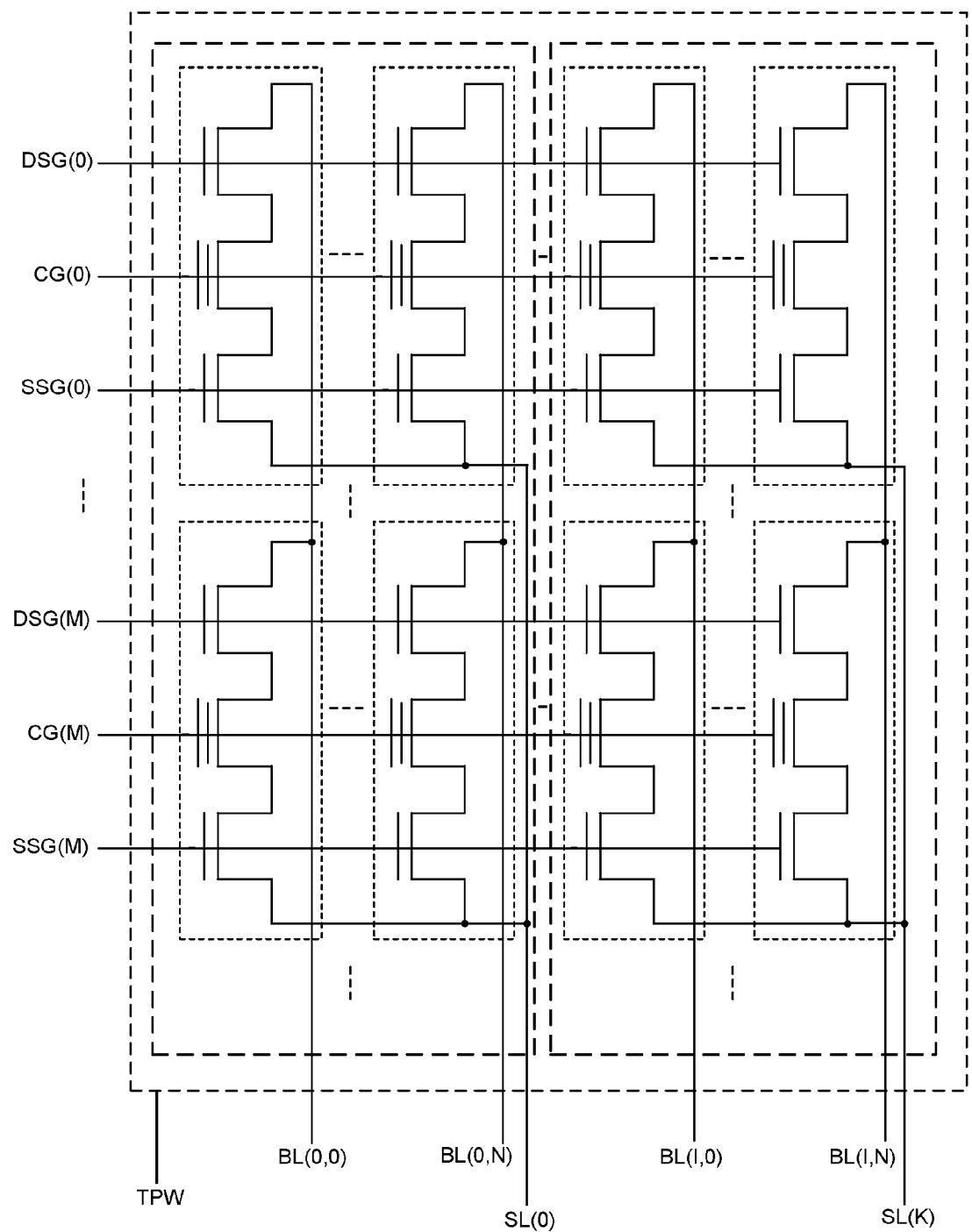
FIG. 26 shows an exemplary embodiment of the array implemented with floating gate NMOS cells.

It should be noted that although it is preferable to use charge-trapping cells rather than floating gate (FG) cells to save mask layers and manufacturing cost, it is obvious that the exemplary embodiments can be also implemented by using floating gate cells. According to the invention, the floating gate cells may be PMOS or NMOS cells FIG. 25 shows an exemplary embodiment of the array implemented with floating gate PMOS cells. FIG. 26 shows an exemplary embodiment of the array implemented with floating gate NMOS cells. The operations of these arrays are similar to the previously described embodiments using PMOS and NMOS charge-trapping cells except that, due to the coupling ratio of the floating gate, these implementations may require higher voltages to perform the erase and program operations.

Figures 27A, 27B:
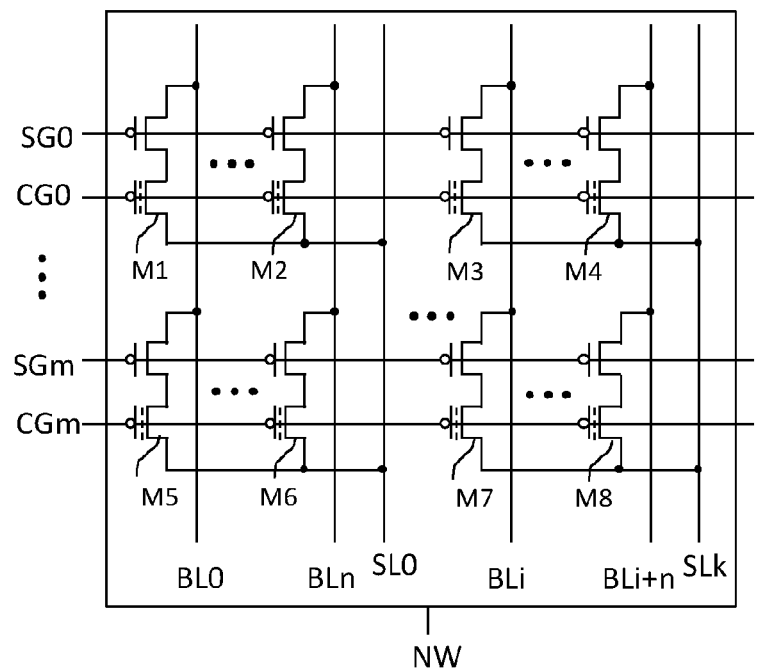
FIG. 27A shows an exemplary embodiment of an array according to the invention, wherein the cells comprise a two-transistor (2T) structure.
FIG. 27B shows exemplary erase bias conditions of the array of FIG. 27A.

FIG. 27A shows another exemplary embodiment of an array according to the invention, wherein the cell contains a two-transistor (2T) structure. FIG. 27B shows exemplary erase bias conditions of this embodiment. This embodiment is similar to the previous 3T embodiments shown in FIGS. 3-5, except that the source select gate (SSG) is removed. In FIG. 27B, the conditions (1) to (3) apply the erase and inhibit voltages from SL. The conditions (4) to (6) applied the erase and inhibit voltages from BL.

Figures 28A, 28B:
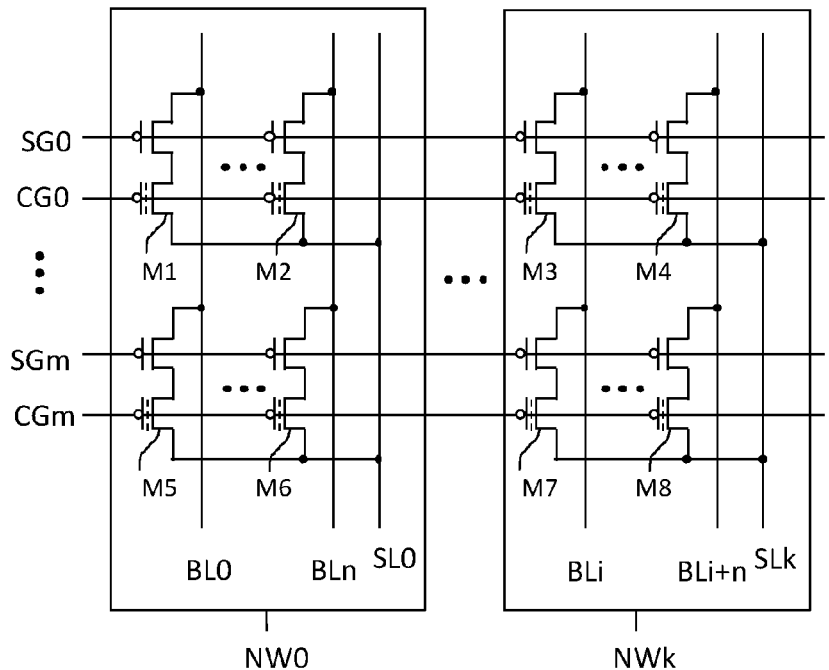
FIG. 28A shows another exemplary embodiment of an array according to the invention wherein the cells are located in separated N-wells.
FIG. 28B shows exemplary erase bias conditions of the array of FIG. 28A.

FIG. 28A shows another exemplary embodiment of an array according to the invention wherein the cells are located in separated N-wells. This allows the selected N-well (NW0) and unselected N-well (NWk) be supplied with different voltages. The exemplary erase bias conditions for this embodiment are shown in FIG. 28B. The conditions (1) to (3) apply the erase and inhibit voltages from SL. The conditions (4) to (6) applied the erase and inhibit voltages from BL.

Figures 29A, 29B:
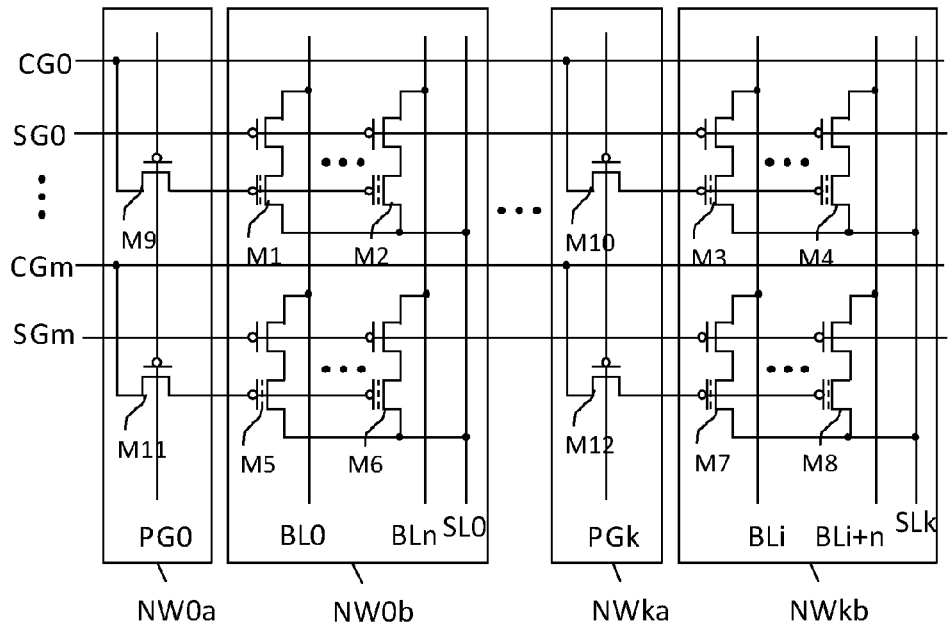
FIG. 29A shows another exemplary embodiment of an array according to the invention wherein the array has additional pass gates connected to the gate of each byte's cells.
FIG. 29B shows exemplary erase bias conditions of the array of FIG. 29A.

FIG. 29A shows another exemplary embodiment of an array according to the invention wherein the array has additional pass gates M9, M10, M11, M12, etc. connected to the gate of each byte's cells. This allows the erase voltage be applied to the gate of a select byte only. Please notice, the pass gates M9-M12 are PMOS that may be located in separated N-wells (NW0a-NWka) from the cells' N-wells (NW0b-NWkb). The exemplary erase bias conditions of this embodiment is shown in FIG. 29B. The conditions (1) to (3) apply the erase and inhibit voltages from SL. The conditions (4) to (6) applied the erase and inhibit voltages from BL. In this embodiment the array size may be increased by the well spacing.

Figures 30A, 30B:
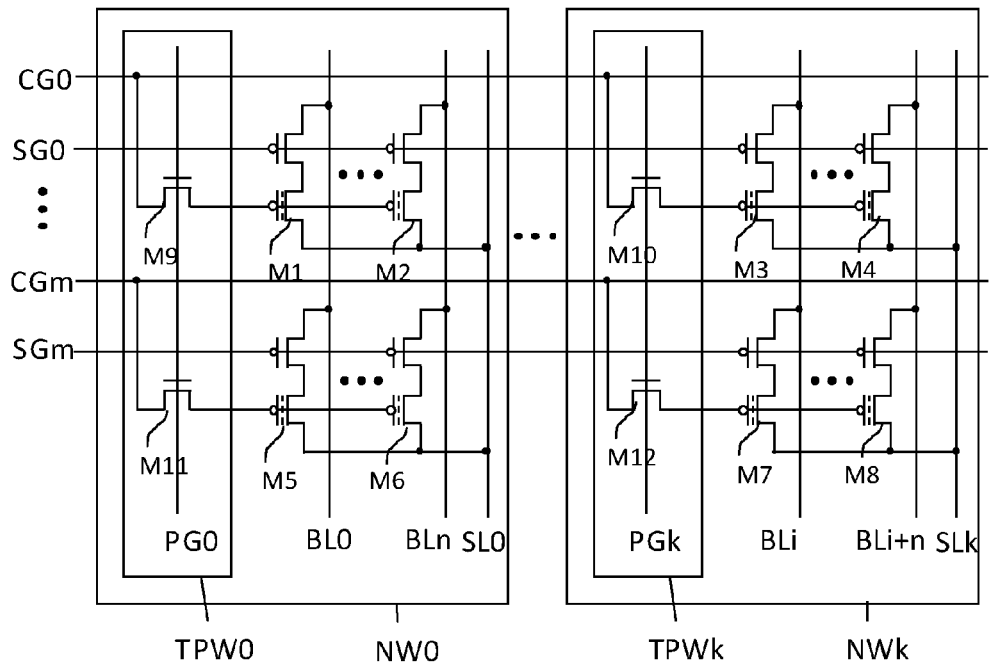
FIG. 30A shows another exemplary embodiment of an array according to the invention wherein the array has additional pass gates connected to the gate of each byte's cells
FIG. 30B shows exemplary erase bias conditions of the array of FIG. 30A.

FIG. 30A shows another exemplary embodiment of an array according to the invention wherein the array has additional pass gates M9, M10, M11, M12, etc. connected to the gate of each byte's cells. However, the pass gates M9-M12 are NMOS that may be located in separated triple P-wells (TPW0-TPWk). The triple P-wells may be located in the cells' N-wells (NW0-NWk) to reduce the well spacing. The exemplary erase bias conditions of this embodiment are shown in FIG. 30B. The conditions (1) to (3) apply the erase and inhibit voltages from SL. The conditions (4) to (6) applied the erase and inhibit voltages from BL. In this embodiment the array size may be increased by the well spacing.

Figure 31A:
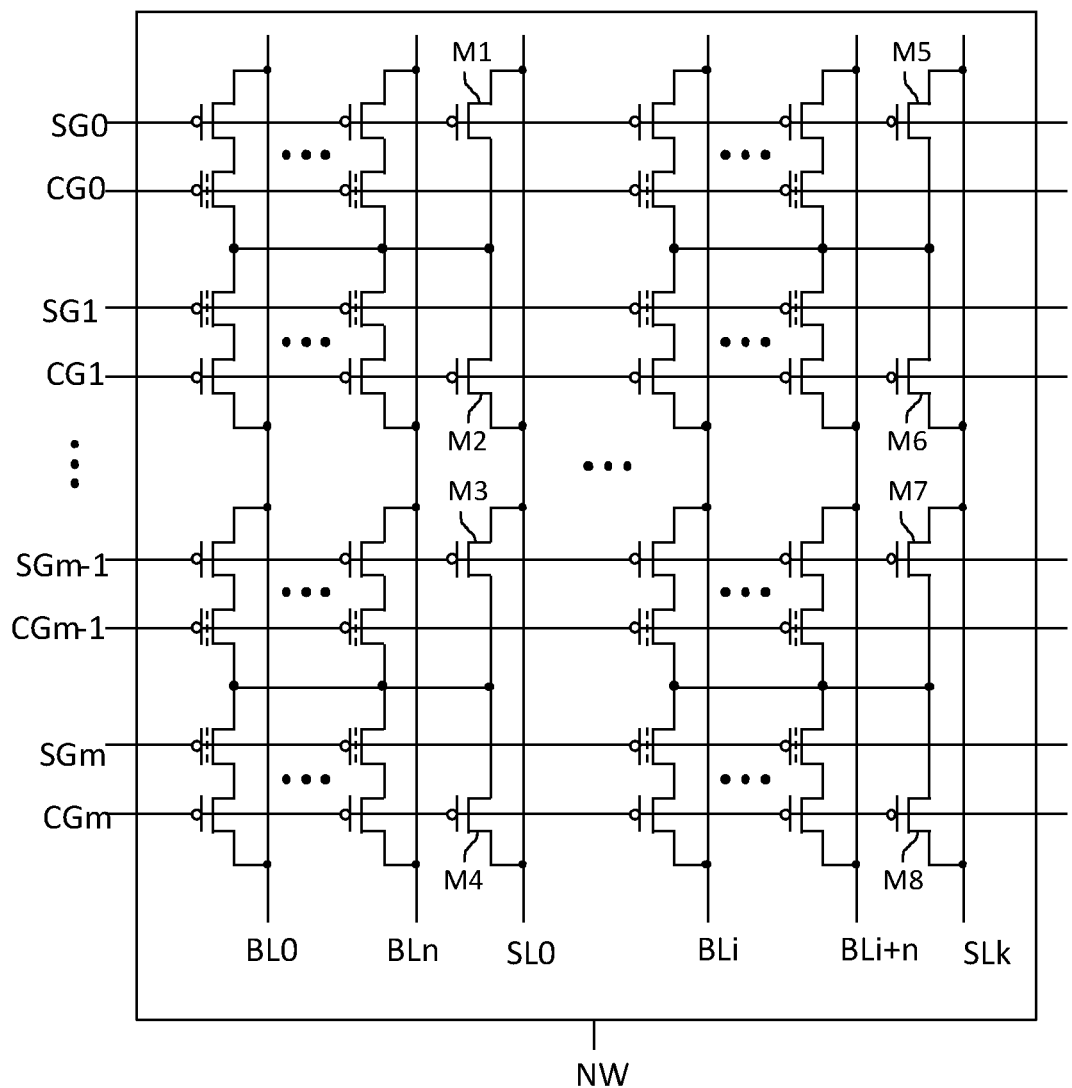
FIG. 31A shows another exemplary embodiment of an array according to the invention wherein the array has additional SL select gates.

FIG. 31A shows another exemplary embodiment of an array according to the invention wherein the array has additional SL select gates M1-M8, etc. According to this embodiment, the gates of select gate transistors are connected to the same cells' select gates SG0-SGm. However, in another exemplary embodiment according to the invention, the gates of the SL select gates M1-M8 are connected to different select signals. These SL select gates allow the SL erase and inhibit voltages to be applied to the source of the select CG's bytes only. The exemplary erase bias conditions of this embodiment are shown in FIG. 31B.

Figures 31B, 31C:
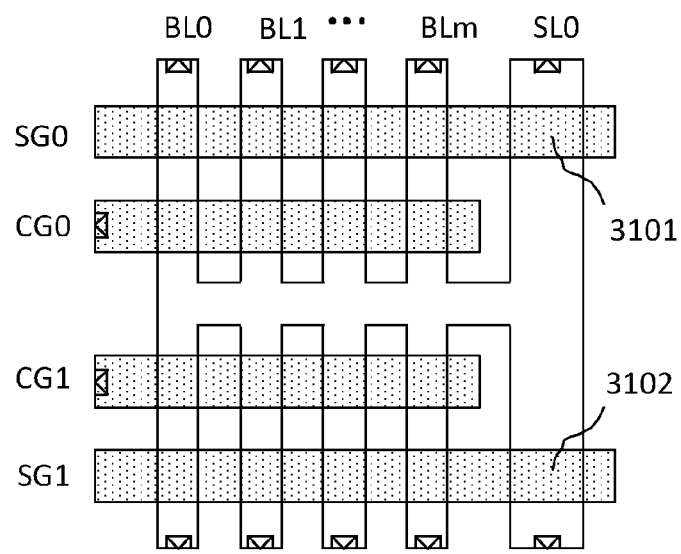
FIG. 31B shows exemplary erase bias conditions of the array of FIG. 31A.
FIG. 31C shows an exemplary layout of SL select gates shown in FIG. 31A.

FIG. 31C shows an exemplary layout of the SL select gates (M1) (3101) and (M2) (3102). It should be noted that the CG0 and CG1 are cut off and connected to the adjacent bytes with metal lines. The SL select gates may have wider channel width than the cells to reduce its resistance.

Figure 32A:
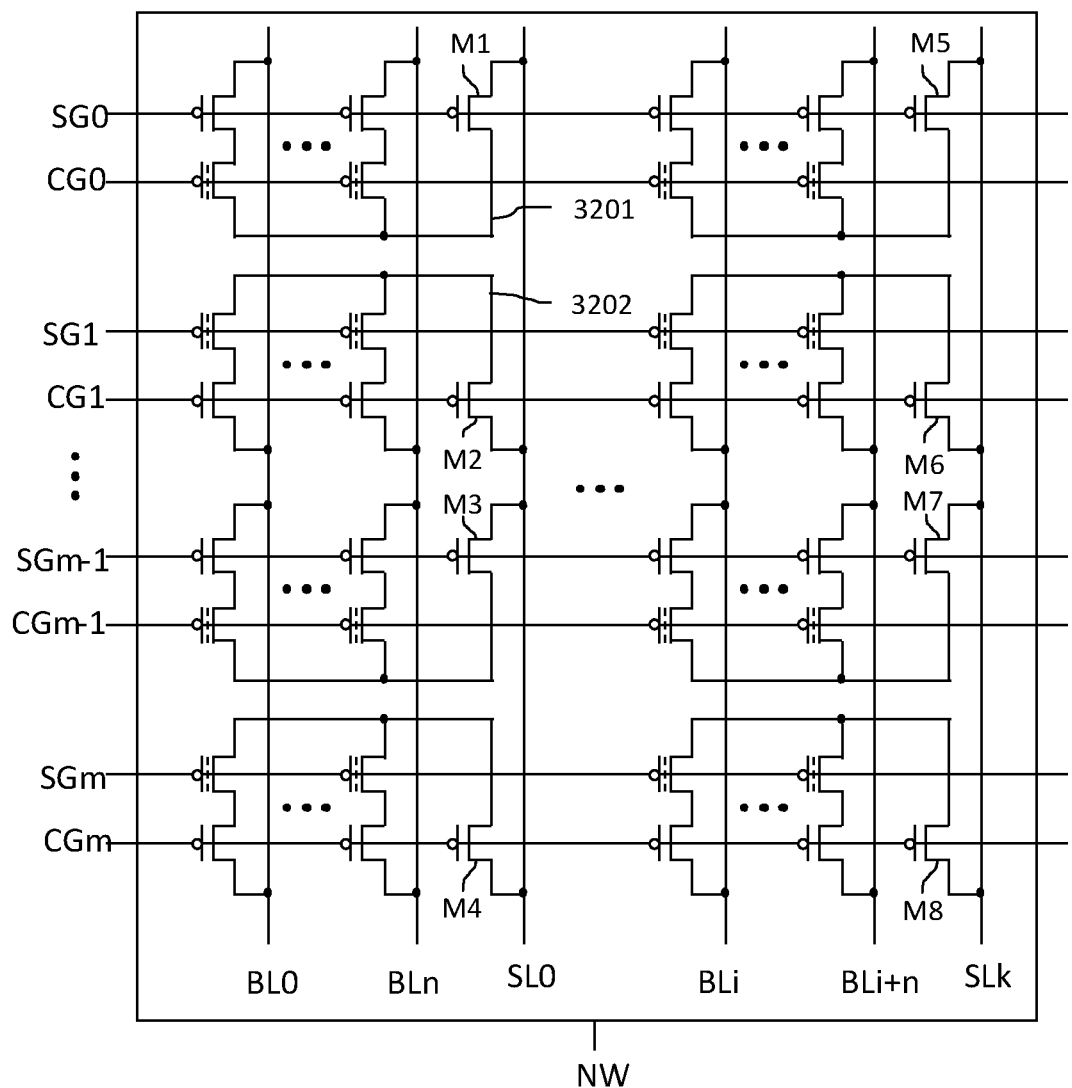
FIG. 32A shows another exemplary embodiment of an array according to the invention.

FIG. 32A shows another exemplary embodiment of an array according to the invention. This embodiment is similar to the one shown in FIG. 31A except the source of each byte is separated from the other byte in adjacent CG, for example, as shown at (3201) and (3202). This embodiment's erase bias conditions are the same as the ones shown in FIG. 31B. The difference between the two embodiments is that this embodiment eliminates the source disturb for the bytes located in the adjacent CG.

Figure 32B:
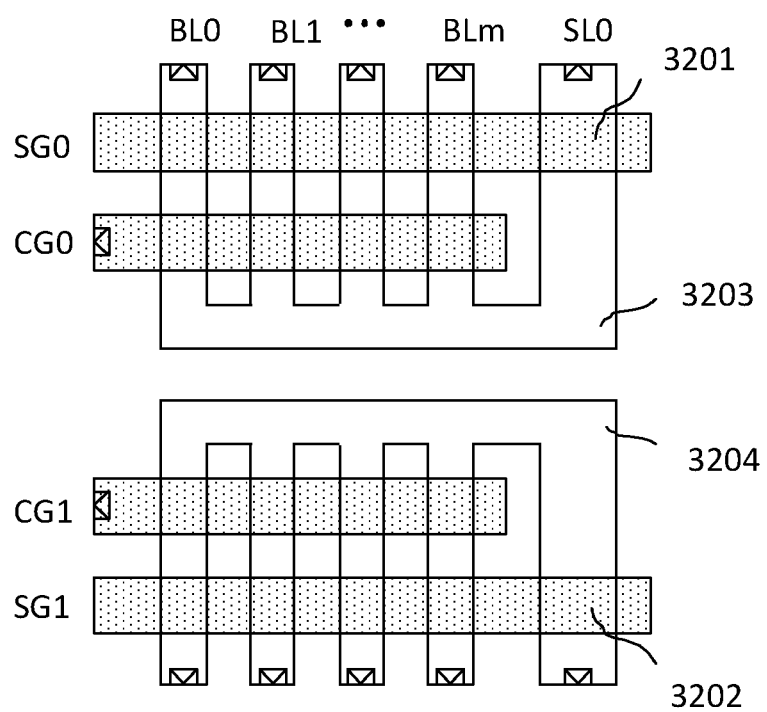
FIG. 32B shows the exemplary layout of the SL select gates and separated sources of the embodiment shown in FIG. 32A.

FIG. 32B shows an exemplary layout of the SL select gates (3201) and (3202), and separated sources (3203) and (3204) shown in FIG. 32A.

Figures 33A, 33B:
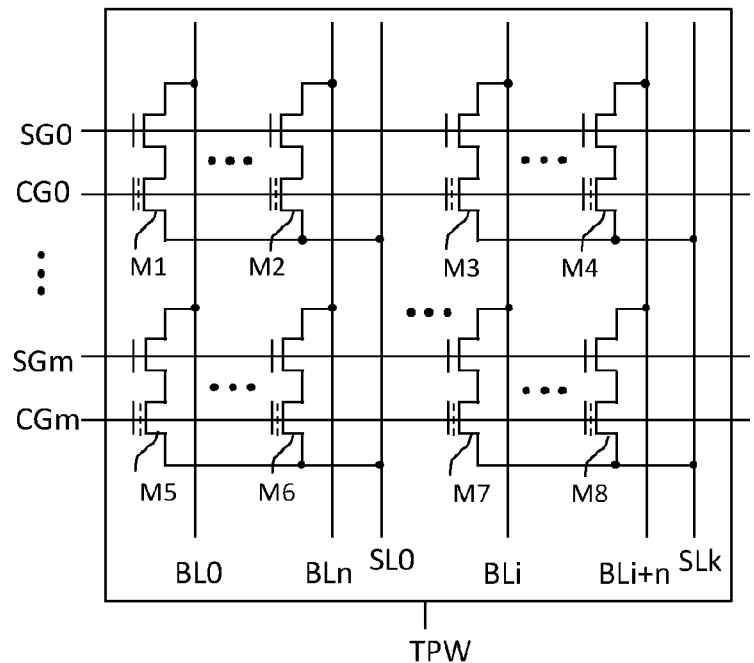
FIG. 33A shows an exemplary embodiment of an array using NMOS cells.
FIG. 33B shows the exemplary erase bias conditions of the embodiment shown in FIG. 33A.

FIG. 33A shows an exemplary embodiment of the array using NMOS cells. FIG. 33B shows the exemplary erase bias conditions of the embodiment. This embodiment is the similar to the one shown in FIGS. 27A-B, except that the polarity of voltages is reversed due to the NMOS devices. The cells may be located in a triple P-well (TPW) that is located in a deep N-well in a common P-substrate process. The deep N-well must be supplied with a voltage higher or equal to the TPW in order to prevent forward current from the TPW to the deep N-well.

Figures 34A, 34B:
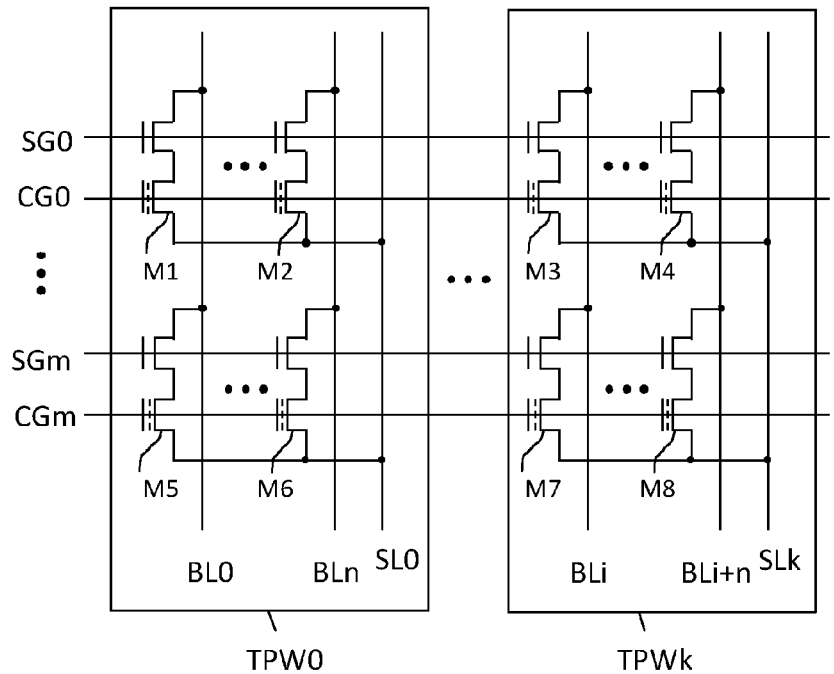
FIG. 34A shows another exemplary embodiment of an array using NMOS cells.
FIG. 34B shows the exemplary erase bias conditions of the embodiment shown in FIG. 34A.

FIG. 34A shows another exemplary embodiment of the array using NMOS cells. FIG. 34B shows the exemplary erase bias conditions of the embodiment. This embodiment is the similar to the one shown in FIGS. 28A-B, except that the polarity of voltages is reversed due to the NMOS devices.

Figures 35A, 35B:
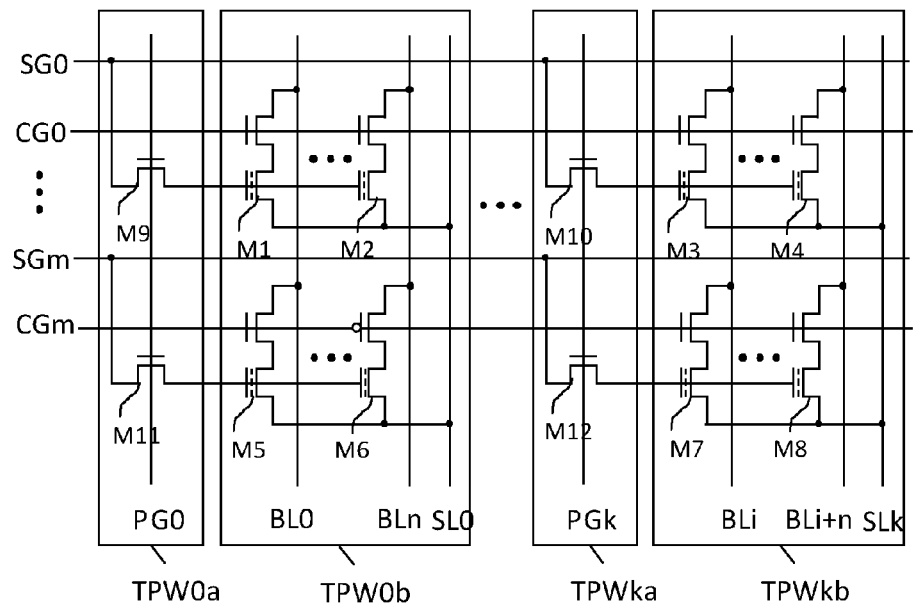
FIG. 35A shows another exemplary embodiment of an array using NMOS cells.
FIG. 35B shows the exemplary erase bias conditions of the embodiment shown in FIG. 35A.

FIG. 35A shows another exemplary embodiment of the array using NMOS cells. FIG. 35B shows the exemplary erase bias conditions of the embodiment. This embodiment is the similar to the one shown in FIGS. 29A-B, except that the polarity of voltages is reversed due to the NMOS devices.

Figures 36A, 36B:
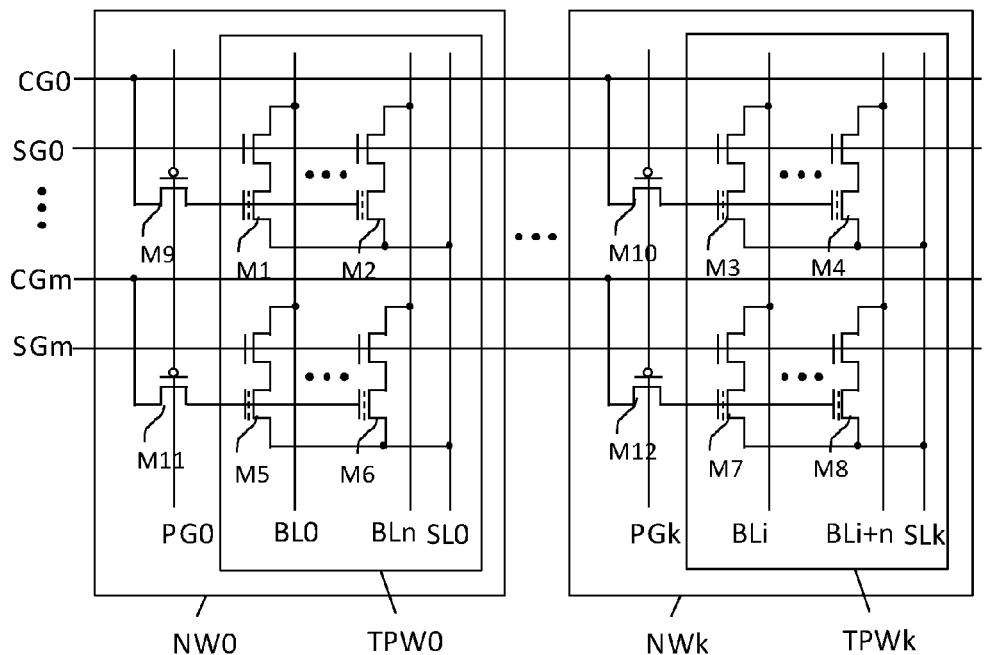
FIG. 36A shows another exemplary embodiment of an array using NMOS cells.
FIG. 36B shows the exemplary erase bias conditions of the embodiment shown in FIG. 36A.

FIG. 36A shows another exemplary embodiment of the array using NMOS cells. FIG. 36B shows the exemplary erase bias conditions of the embodiment. This embodiment is the similar to the one shown in FIGS. 30A-B, except that the polarity of voltages is reversed due to the NMOS devices.

Figures 37A, 37B:
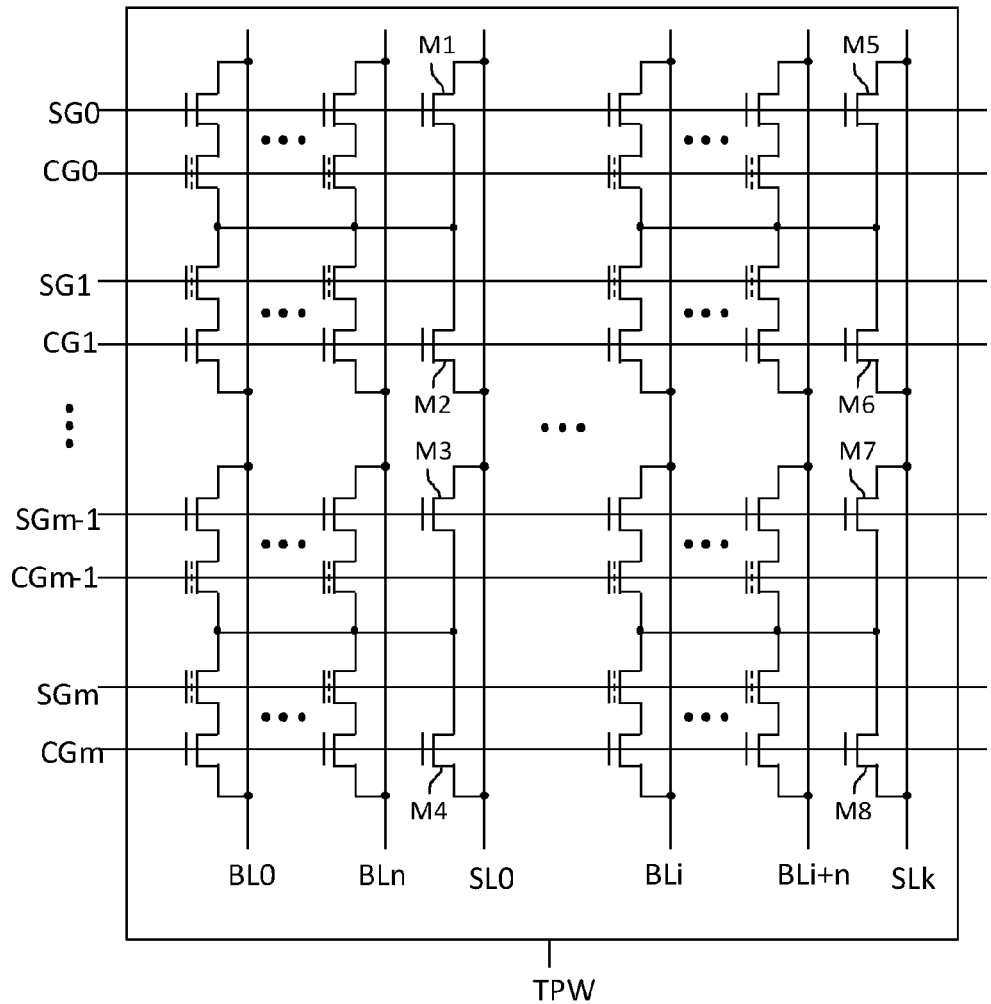
FIG. 37A shows another exemplary embodiment of an array using NMOS cells.
FIG. 37B shows the exemplary erase bias conditions of the embodiment shown in FIG. 37A.

FIG. 37A shows another exemplary embodiment of the array using NMOS cells. FIG. 37B shows the exemplary erase bias conditions of the embodiment. This embodiment is the similar to the one shown in FIGS. 31A-1B, except that the polarity of voltages is reversed due to the NMOS devices.

Figure 38:
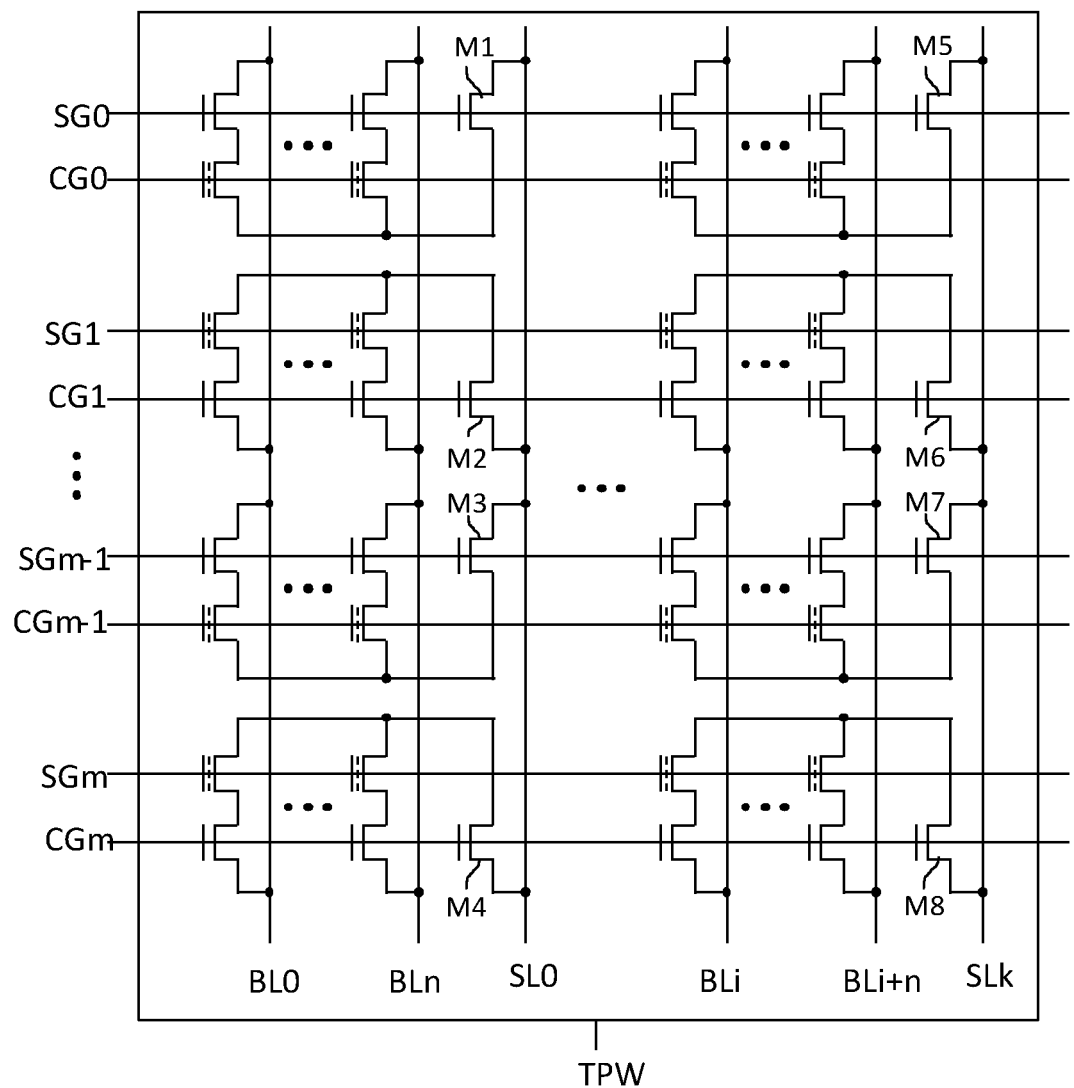
FIG. 38 shows another exemplary embodiment of an array using NMOS cells

FIG. 38 shows another exemplary embodiment of the array using NMOS cells. This embodiment is the similar to the one shown in FIG. 32A, except that the polarity of voltages is reversed due to the NMOS devices.

Besides the above-described embodiments, any other typical design features of the memory array architectures, such as divided bit line, divided word line, divided well, and many others may be applied to the embodiments of the disclosed array. These modifications shall be remained within the scope of the invention.

In another exemplary embodiment, the array comprises dual-cells to enhance the data integrity in which data and its complement are stored in two cells. One cell stores the data and the other cell stores the complementary data. The two cells may be located in two bit-lines referred to as BL and BLB. The two bit lines can be located in one array or two separated arrays. When read, both cells are read and their cell current is compared to decide what the data value is.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. An apparatus, comprising:
a plurality of SONOS memory cells forming an EEPROM memory array;
a controller that generates bias voltages to program and erase the memory cells, wherein the controller performs a refresh operation when programming selected memory cells to reduce write-disturb on unselected memory cells to prevent data loss, wherein the memory cells are grouped into segments and wherein each segment comprises a selected number of bit lines, and each of the bit lines is coupled to a selected number of the memory cells of the segment; and
a word line (WL) register, bit line (BL) register and source line (SL) register that are coupled to the controller and to the memory array, wherein the controller controls the WL register to: output drain select signals that are coupled to the DSGs, output control gate signals that are coupled to the CGs, and output source select signals that are coupled to the SSGs,
wherein the controller controls the WL, BL, and SL registers to erase and program the storage transistor of selected memory cells using bias conditions selected from a set comprising source line bias conditions, bit line bias conditions, band-to-band-tunneling (BTBT) bias conditions, punch-through-assisted-hot-electron (PAHE) bias conditions, and channel-hot-electron (CHE) bias conditions,
wherein the controller sets the source line bias conditions for a selected cell so that its bias conditions are (CG=−5 volts, DSG=5 volts, SSG=−1 volts, the bit line is floating, SL=5 volts, and NW=5 volts), and wherein the controller sets the source line bias conditions for an unselected cell so that its bias conditions are (CG=5 volts, DSG=5 volts, SSG=5 volts, bit line is floating, and SL=0 volts).

2. The apparatus of claim 1, wherein the memory array comprises the SONOS memory cells formed on a single N-well.

3. The apparatus of claim 1, wherein each of the SONOS memory cells comprise three transistors that include a storage transistor having a control gate (CG), a first transistor coupled to a drain side of the storage transistor and having a drain select gate (DSG), and a second transistor coupled to a source side of the storage transistor and having a source select gate (SSG).

4. The apparatus of claim 3, wherein the storage transistor includes a charge-trapping layer that includes an Oxide-Nitride-Oxide (ONO) layer to store charge.

5. The apparatus of claim 1, wherein the controller sets the bit line bias conditions for a selected cell so that its bias conditions are CG=−5 volts, DSG=−1 volts, SSG=5 volts, the bit line=5 volts, SL is floating, and NW=5 volts, and wherein the controller sets the bit line bias conditions for an unselected cell so that its bias conditions are CG=5 volts, DSG=5 volts, SSG=5 volts, bit line=0 volts, and SL is floating.

6. The apparatus of claim 1, wherein the controller sets the BTBT bias conditions for a selected cell so that its bias conditions are CG=5 volts, DSG=−1 volts, SSG=5 volts, bit line=0 volts, SL is floating, and NW=5 volts, and wherein the controller sets the BTBT bias conditions for an unselected cell so that its bias conditions are CG=5 volts, DSG=5 volts, SSG=5 volts, bit line=5 volts, and SL is floating.

7. The apparatus of claim 1, wherein the controller sets the PAHE bias conditions for a selected cell so that its bias conditions are CG=5 volts, DSG=−1 volts, SSG=0 volts, bit line=0 volts, SL=5 volts, and NW=5 volts, and wherein the controller sets the PAHE bias conditions for an unselected cell so that its bias conditions are CG=5 volts, DSG=5 volts, SSG=5 volts, bit line=5 volts, and SL is floating.

8. The apparatus of claim 1, wherein the controller sets the CHE bias conditions for a selected cell so that its bias conditions are CG=4 volts, DSG=−1 volts, SSG=0 volts, bit line=0 volts, SL=5 volts, and NW=5 volts, and wherein the controller sets the CHE bias conditions for an unselected cell so that its bias conditions are CG=5 volts, DSG=5 volts, SSG=5 volts, bit line=5 volts, and SL is floating.

9. The apparatus of claim 1, wherein the write-disturb causes a voltage threshold (Vt) of a particular unselected memory cell to change from an original voltage level to a write-disturb voltage level.

10. The apparatus of claim 9, wherein the refresh operation restores the Vt of the particular unselected memory cell to the original voltage level.

11. The apparatus of claim 1, wherein the memory cells comprise PMOS transistor devices.

12. The apparatus of claim 1, wherein the memory cells comprise NMOS transistor devices.

13. An apparatus, comprising:
a plurality of SONOS memory cells forming an EEPROM memory array;
a controller that generates bias voltages to program and erase the memory cells, and wherein the controller performs a refresh operation when programming selected memory cells to reduce write-disturb on unselected memory cells to prevent data loss, wherein the memory cells are grouped into segments and wherein each segment comprises a selected number of bit lines, and each of the bit lines is coupled to a selected number of the memory cells of the segment; and
a word line (WL) register, bit line (BL) register and source line (SL) register that are coupled to the controller and to the memory array, wherein the controller controls the WL register to: output drain select signals that are coupled to the DSGs, output control gate signals that are coupled to the CGs, and output source select signals that are coupled to the SSGs,
wherein the controller controls the WL, BL, and SL registers to erase and program the storage transistor of selected memory cells using bias conditions selected from a set comprising source line bias conditions, bit line bias conditions, band-to-band-tunneling (BTBT) bias conditions, punch-through-assisted-hot-electron (PAHE) bias conditions, and channel-hot-electron (CHE) bias conditions,
wherein the controller sets the bit line bias conditions for a selected cell so that its bias conditions are (CG=−5 volts, DSG=−1 volts, SSG=5 volts, the bit line=5 volts, SL is floating, and NW=5 volts), and wherein the controller sets the bit line bias conditions for an unselected cell so that its bias conditions are (CG=5 volts, DSG=5 volts, SSG=5 volts, bit line=0 volts, and SL is floating).

14. The apparatus of claim 13, wherein the memory array comprises the SONOS memory cells formed on a single N-well.

15. The apparatus of claim 13, wherein each of the SONOS memory cells comprise three transistors that include a storage transistor having a control gate (CG), a first transistor coupled to a drain side of the storage transistor and having a drain select gate (DSG), and a second transistor coupled to a source side of the storage transistor and having a source select gate (SSG).

16. The apparatus of claim 15, wherein the storage transistor includes a charge-trapping layer that includes an Oxide-Nitride-Oxide (ONO) layer to store charge.

17. An apparatus, comprising:
a plurality of SONOS memory cells forming an EEPROM memory array;
a controller that generates bias voltages to program and erase the memory cells, and wherein the controller performs a refresh operation when programming selected memory cells to reduce write-disturb on unselected memory cells to prevent data loss, wherein the memory cells are grouped into segments and wherein each segment comprises a selected number of bit lines, and each of the bit lines is coupled to a selected number of the memory cells of the segment; and
a word line (WL) register, bit line (BL) register and source line (SL) register that are coupled to the controller and to the memory array, wherein the controller controls the WL register to: output drain select signals that are coupled to the DSGs, output control gate signals that are coupled to the CGs, and output source select signals that are coupled to the SSGs,
wherein the controller controls the WL, BL, and SL registers to erase and program the storage transistor of selected memory cells using bias conditions selected from a set comprising source line bias conditions, bit line bias conditions, band-to-band-tunneling (BTBT) bias conditions, punch-through-assisted-hot-electron (PAHE) bias conditions, and channel-hot-electron (CHE) bias conditions,
wherein the controller sets the CHE bias conditions for a selected cell so that its bias conditions are (CG=4 volts, DSG=−1 volts, SSG=0 volts, bit line=0 volts, SL=5 volts, and NW=5 volts), and wherein the controller sets the CHE bias conditions for an unselected cell so that its bias conditions are (CG=5 volts, DSG=5 volts, SSG=5 volts, bit line=5 volts, and SL is floating).

18. The apparatus of claim 17, wherein the write-disturb causes a voltage threshold (Vt) of a particular unselected memory cell to change from an original voltage level to a write-disturb voltage level.

19. The apparatus of claim 17, wherein the memory cells comprise PMOS transistor devices.

20. The apparatus of claim 17, wherein the memory cells comprise NMOS transistor devices.

* * * * *